(12) United States Patent
Marbell

(10) Patent No.: US 12,068,265 B2
(45) Date of Patent: Aug. 20, 2024

(54) DEVICE HAVING A COUPLED INTERSTAGE TRANSFORMER AND PROCESS IMPLEMENTING THE SAME

(71) Applicant: WOLFSPEED, INC., Durham, NC (US)

(72) Inventor: Marvin Marbell, Cary, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 73 days.

(21) Appl. No.: 17/560,811

(22) Filed: Dec. 23, 2021

(65) Prior Publication Data

US 2023/0207496 A1    Jun. 29, 2023

(51) Int. Cl.
| | |
|---|---|
| *H01L 23/66* | (2006.01) |
| *H01L 23/00* | (2006.01) |
| *H01L 23/495* | (2006.01) |
| *H01L 25/00* | (2006.01) |
| *H01L 25/18* | (2023.01) |

(52) U.S. Cl.
CPC ........ *H01L 23/66* (2013.01); *H01L 23/49575* (2013.01); *H01L 24/48* (2013.01); *H01L 25/18* (2013.01); *H01L 25/50* (2013.01); *H01L 2223/6655* (2013.01); *H01L 2224/48175* (2013.01); *H01L 2224/48195* (2013.01)

(58) Field of Classification Search
CPC ... H01L 23/66; H01L 23/49575; H01L 24/48; H01L 25/18; H01L 25/50; H01L 2223/6655; H01L 2224/48175; H01L 2224/48195; H01L 23/4334; H01L 24/45; H01L 2223/6644; H01L 23/645; H01L 2223/6611; H01L 24/49; H03F 1/00
See application file for complete search history.

(56) References Cited

U.S. PATENT DOCUMENTS

| | | |
|---|---|---|
| 9,337,183 B2 | 5/2016 | Marbell et al. |
| 9,589,916 B2 | 3/2017 | Marbell et al. |
| 9,628,032 B1 | 4/2017 | Marbell et al. |
| 2017/0117239 A1* | 4/2017 | Lembeye ............... H03F 1/565 |

\* cited by examiner

*Primary Examiner* — Elias Ullah
(74) *Attorney, Agent, or Firm* — BakerHostetler

(57) ABSTRACT

A device that includes a metal submount; a first transistor die arranged on said metal submount; a second transistor die arranged on said metal submount; a set of primary interconnects; and a set of secondary interconnects. Additionally, the set of primary interconnects and the set of secondary interconnects are configured to provide RF signal coupling between the first transistor die and the second transistor die by electromagnetic coupling.

27 Claims, 23 Drawing Sheets

DEVICE HAVING A COUPLED INTERSTAGE TRANSFORMER AND PROCESS IMPLEMENTING THE SAME

FIELD OF THE DISCLOSURE

The disclosure relates to a device having a coupled interstage transformer. The disclosure further relates to a process of implementing a device having a coupled interstage transformer.

BACKGROUND OF THE DISCLOSURE

Transistor packages such as radio frequency (RF) power amplifier transistor products implement interstage matching. Present technology typically used for interstage matching uses a number of components electrically connected to one another with physical electrical connections. For example, typical interstage matching uses a shunt L-C (inductor-capacitor) network on an output of the driver stage and an input of the final stage transistor dies respectively. There is typically also a series capacitor that serves as a DC block and a matching element in the interstage matching. For example, the interstage matching uses a shunt L-C, series C (capacitor), and shunt L-C topology. In this regard, the DC block between the driver stage and final stage is needed to provide stability.

For example, FIG. 23 illustrates an equivalent circuit for a prior art two stage amplifier 10 with interstage match. As illustrated in FIG. 23, the prior art two-stage amplifier 10 includes a final stage transistor die 1, a driver stage transistor die 2, a shunt L-C network 4, and a DC block and/or interstage matching capacitor 3. The shunt L-C network 4 is physically wired to the final stage transistor die 1 and the driver stage transistor die 2.

However, the DC block increases manufacturing cost, manufacturing complexity, consumes additional device real estate, and/or the like. Additionally, a two-stage amplifier may have undesirable low frequency signals and/or undesirable low frequency gain that may impact stability. Further, a two-stage amplifier may have limited band impedance when implementing matching through a L-C network match.

Accordingly, what is needed is a RF product configured for decreased manufacturing cost, decreased manufacturing complexity, decreased consumption of device real estate, and/or the like. Additionally, what is needed is a RF product configured for reduction of undesirable low frequency signals, reduction of undesirable low frequency gain, increased stability, increased band impedance, and/or the like.

SUMMARY OF THE DISCLOSURE

One aspect includes a device that includes a metal submount; a first transistor die arranged on said metal submount; a second transistor die arranged on said metal submount; a set of primary interconnects; and a set of secondary interconnects, where the set of primary interconnects and the set of secondary interconnects are configured to provide RF signal coupling between the first transistor die and the second transistor die by electromagnetic coupling.

One aspect includes a process for implementing a device that includes providing a metal submount; arranging a first transistor die on said metal submount; arranging a second transistor die on said metal submount; providing a set of primary interconnects; and providing a set of secondary interconnects, where the set of primary interconnects and the set of secondary interconnects are configured to provide RF signal coupling between the first transistor die and the second transistor die by electromagnetic coupling.

One aspect includes a device that includes a metal submount; a first transistor die arranged on said metal submount; a second transistor die arranged on said metal submount; a set of primary interconnects; and a set of secondary interconnects, where the set of primary interconnects and the set of secondary interconnects are configured to provide RF signal coupling between the first transistor die and the second transistor die without a physical connection.

One aspect includes a process for implementing a device that includes providing a metal submount; arranging a first transistor die on said metal submount; arranging a second transistor die on said metal submount; providing a set of primary interconnects; and providing a set of secondary interconnects, where the set of primary interconnects and the set of secondary interconnects are configured to provide RF signal coupling between the first transistor die and the second transistor die without a physical connection.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 8 illustrates an equivalent circuit schematic of the package 100 and includes equivalent circuit portions for the first IPD implementation 500, the second IPD implementation 300, and/or the like.

DETAILED DESCRIPTION OF THE DISCLOSURE

Figure 1:
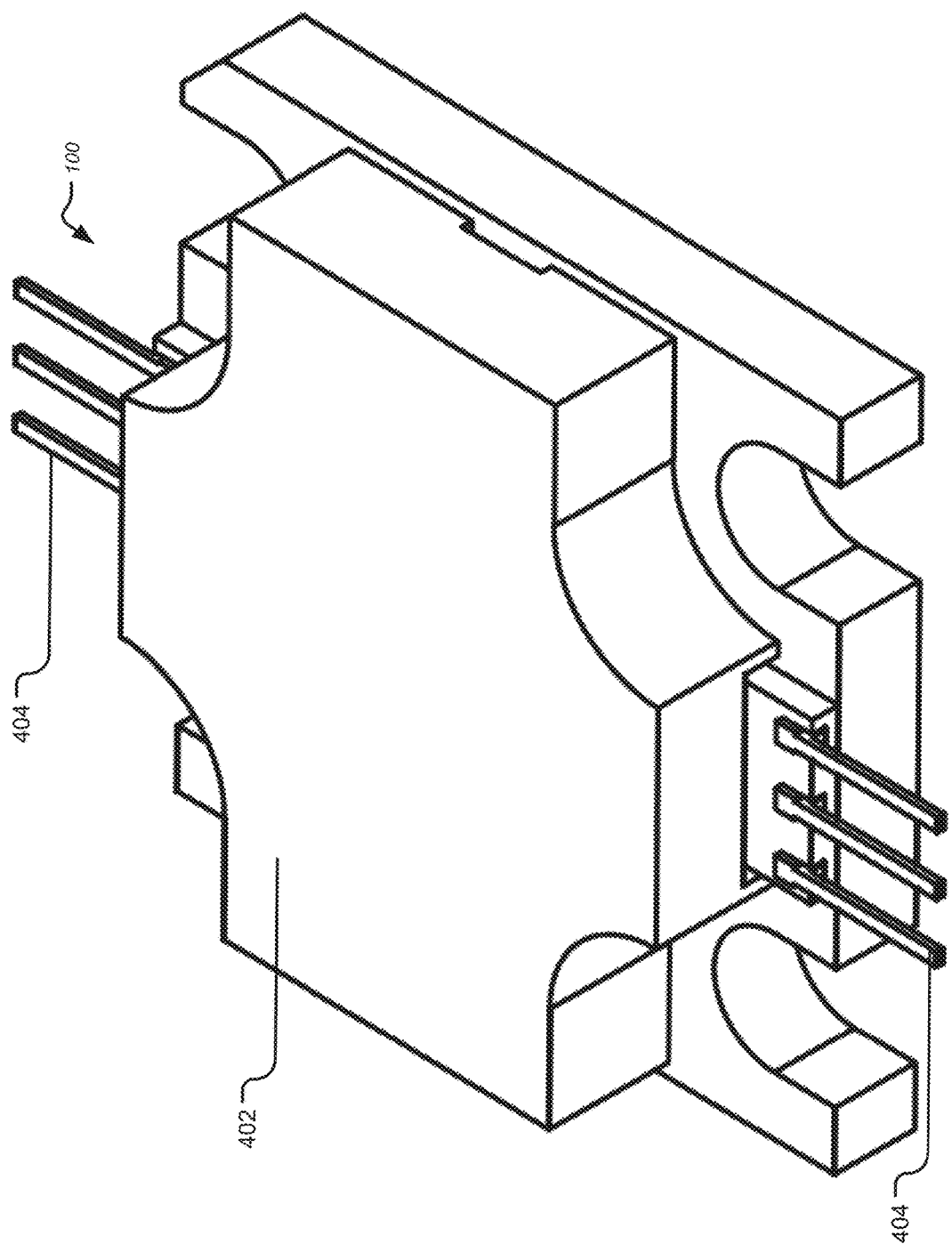
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure further relates to a radio frequency (RF) power amplifier transistor package implementing an interstage transformer. The disclosure further relates to a process of making an interstage transformer. The disclosure further relates to a process of making a package implementing an interstage transformer. The disclosure further relates to a process of making an RF package implementing an interstage transformer. The disclosure further relates to a process of making a Radio frequency (RF) power amplifier transistor package implementing an interstage transformer.

The disclosure further relates to a device having a coupled wire bond interstage transformer. The disclosure further relates to a process of implementing device having a coupled wire bond interstage transformer. The disclosure further relates to a radio frequency (RF) package implementing a coupled wire bond interstage transformer. The disclosure further relates to a radio frequency (RF) power amplifier transistor package implementing a coupled wire bond interstage transformer. The disclosure further relates to a process of making a coupled wire bond interstage transformer. The disclosure further relates to a process of making a package implementing a coupled wire bond interstage transformer. The disclosure further relates to a process of making an RF package implementing a coupled wire bond interstage transformer. The disclosure further relates to a process of making a Radio frequency (RF) power amplifier transistor package implementing a coupled wire bond interstage transformer.

DETAILED DESCRIPTION OF THE DISCLOSURE

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects of the disclosure relate to an arrangement of wire bonds and capacitors to function as an interstage match. For example, to provide improved matching from an output of a driver stage transistor to input of a final stage transistor. Aspects of the disclosure make use of RF signal coupling from one set of wires (primary set) to another set of wires (secondary set) to transfer a signal from the driver stage to the final stage. This is similar to the principle on which a transformer works, but in this case, the windings of the transformer are wire-bond sets, and a core of the transformer is air or a dielectric surrounding the wires. Since the RF signal is coupled through the air or a dielectric surrounding the wires, there is no need for a physical connection between the driver stage and final stage, and this has some protective benefits for the transistor die. In aspects of the disclosure, there is also no need for a DC block between the driver stage and final stage because the DC and a low frequency signal cannot couple through the air. Unwanted low frequency signals are automatically attenuated, whereas the desired RF signal is effectively coupled through the transformer, and gives a more stable two-stage amplifier.

Present technology typically used for interstage matching uses a shunt L-C, network on the output of the driver stage and input of the final stage transistor dies respectively. There is also a series capacitor that serves as a DC block and a matching element in the interstage. Aspects of the disclosure may not need a series capacitor and/or DC block between the driver stage and final stage because there is already a physical separation between the driver and final transistor dies. The electrical connection between driver stage and final stage is achieved through coupling of RF signal from one set of bond wires (primary set) to another (secondary set).

Since higher frequency signals couple more effectively from and/or to wire bonds than lower frequency signals, this transformer based interstage automatically attenuates low frequency signals as well as DC. This is useful for keeping the two-stage transistor stable. Typically the transistor gain at low frequencies is very high, and putting two high gain stages together leads to stability and oscillation problems. The inherent damping of low frequency gain provided by the disclosed device is useful in controlling the low frequency gain of a two-stage amplifier and keeping it stable.

The transformer-based topology of the disclosure may be more broadband than the typical prior art topology using shunt inductance and/or series capacitance. Impedance transformation can be achieved in a transformer by adjusting a ratio of primary to secondary wires. In this case, a number of primary bond wires to secondary bond wires. For example, a 50 ohm to 5 ohm impedance transformation (10:1 impedance ratio) can be achieved by having 10 secondary wires to every 1 primary wire. This can give a much broader band impedance matching than a L-C network match. Thus, the transformer based interstage can be used to design wider band two-stage amplifiers.

In aspects of the disclosure, the wire bonds leading from the driver die to the final die can be designed to fan out. This is useful because the final stage die is typically 5-7 times larger than the driver die, and so a fan-out design more naturally fits from a driver die, which may have a smaller periphery and/or physical size, to a final die, which may have a larger periphery and physical size. Without a fan out approach, there may be some step mismatch in the two-stage amplifier design, which can also limit bandwidth.

Additionally, with a fan-out design, the wire bonds in a center of the transformer may have a shorter distance to travel, than the wires at the edges of the fan. In order to avoid having different inductance in the center than at the sides, loop heights of the wire bond transformer array can be graded and/or profiled such that the wires in the center of the fan are taller than the wires at the edges of the fan. This way all the wires can have equal length and inductance.

In aspects of the disclosure, the wire-bond transformer may make use of inter-digitated capacitors such that two capacitors may be integrated onto the same physical chip, but are electrically separated from each other.

In aspects of the disclosure, there is a potential for lower cost. Most of the wire-bond transformer may be implemented by wire bonds spanning over bare flange. Accordingly, the capacitors and/or Integrated Passive Devices (IPDs) used can be fairly small form factor, and if they are made with a high-Q, high thermal conductivity processes and/or substrates including silicon carbide (SiC), may then have a small form factor that may translate to cost savings. Prior-art interstage implementations use a large Monolithic microwave integrated circuit (MMIC) approach where the driver die, the final stage die, and interstage match are all integrated together on a large MMIC; or the interstage IPD has to fill most of the space between the driver die and final die. Either approach is more expensive.

Since the capacitor IPDs used in this disclosure have a fairly small form factor, in one aspect they can be integrated onto the driver stage die and final stage die without much increase in total chip periphery and/or cost. Accordingly, a separate interstage IPD may not needed, and the wire-bond transformer can be formed by connecting wire bonds directly from driver to final stage die chips.

In aspects of the disclosure, a two-stage amplifier may include a RF product package, the final stage transistor die, and a driver stage transistor die. Typically the final stage die is 4-7 times larger in size and periphery than the driver. The input impedance of the final stage die may be matched to the output impedance of the driver stage die such that the two-stage amplifier may have gain and gain-flatness over the bandwidth of the amplifier. This matching may be implemented by the coupled wire bond interstage match including a first interdigitated capacitor array, a second interdigitated capacitor array, and an arrangement of primary and secondary wire bonds.

The primary wire bonds may connect the RF signal from the driver die to the primary capacitors on the first and second interdigitated capacitor array. The secondary wire bonds may connect the RF signal from the secondary capacitors on the first and second interdigitated capacitor arrays to the final stage transistor die. The primary and secondary wires may be physically separated from each other, but electrically coupled to each other at RF frequencies. Similarly, the primary and secondary capacitors may be physically interdigitated onto the same chip, but electrically isolated from each other. In aspects, there may be an increase in chip size going from the driver die, the first capacitor array, the second capacitor array, and the final die. Accordingly, the wire bonds may fan-out as the chip size gets bigger. The RF product package may have leads for RF input and RF output, as well as DC pins for the DC drain voltage of the driver die and DC gate voltage of the final die. Gate voltage to the final die can be fed through the secondary wire set.

In aspects of the disclosure, there may be no physical connection between the driver and final stage die, only the mutual inductance between the primary wire bond set and secondary wire bond set that allows the RF signal to couple from driver to final die. The driver die may be physically connected to the primary capacitors (bottom) of the first and second capacitor arrays, and the final die may be physically connected to the secondary capacitors (top) of the first and second capacitor arrays.

In aspects of the disclosure, loop heights of the wires may be profiled and/or graded to be slightly taller in the middle of the fan, and slightly shorter at the fan edges. Since the wires in the center have a shorter distance to travel, by making the wires, aspects of the disclosure may compensate to obtain the same total wire length, and thus the same inductance for all the wires. This feature may be implemented in modern wire-bond machines, such as H&K bonder (available from SGC Equipment, Austin, Texas) by setting a fixed wire length and not a fixed loop height. Accordingly, the loop height may be automatically adjusted, to maintain same wire length across all wires within a wire set.

In aspects of the disclosure, in order to have broad band impedance transformation, the ratio of primary to secondary wires can be changed to aid in the impedance transformation. In aspects of the disclosure, the primary and secondary capacitors may be integrated onto one chip (dual capacitor IPD), but are not interdigitated. Each capacitor may have a separate bond pad, thus each dual capacitor IPD may have two continuous bond pads. The first and second dual capacitor chips may have the same physical size. The wire bonds may not fan-out, and may have the same loop heights across the array. This implementation may be easier to fabricate and manufacture in volume, with a slight trade-off in the mutual coupling coefficient of the transformer. Since the starting and landing feet of the wire bonds are not aligned, the mutual coupling (coupling coefficient) is slightly reduced, but still enough for a decent interstage match. This aspect may also be better for feeding a uniform DC gate voltage to all tubs of the final transistor die.

In aspects of the disclosure, the capacitor arrays and some inductance may be integrated onto the same chips as the transistor die. The second interdigitated capacitor array may be integrated onto the final transistor die chip on the input side. The first dual capacitor array may also be integrated onto the output side of the driver transistor die. For the driver die, the capacitors may be placed in a dual capacitor form, and may not be implemented with an interdigitated capacitor form, because the chip is smaller, and there may not be enough space for each bond pad in the interdigitated format. The primary and secondary wire bonds of the transformer may be bonded directly from the integrated driver die to the integrated final die. Though the die size increases slightly, there may be no interstage IPDs needed in between transistor dies.

In aspects of the disclosure for higher frequency operation, the input impedance of the final stage die can be very low, and challenging to match, so a shunt L-C network on the input may greatly improve the ability to implement a broadband match. A first set of wire bonds on the input of the final die, create a shunt L match. The secondary capacitor on the second dual capacitor IPD may be used for this shunt LC match. Another set of wires may come directly of the input gate pads of the final die to form the secondary wire bond set. The driver die and primary wire bond sets may be similar to other aspects described herein.

Aspects of the disclosure can be used in RF power products for 5G applications, base-station applications, and/or the like. Aspects of the disclosure can be used in can cover Multimode Multiple Input Multiple Output (mMimo) applications, CIFR (cellular infrastructure) applications, and/or the like. For example, aspects of the disclosure can cover mMimo with 1 W-20 W average power applications, CIFR macro with 40 W-80 W average power applications, and/or the like.

Additionally, aspects of the disclosure may be used in any high frequency two-stage power amplifier application including, for example radar, satellite communication, A&D (Aerospace and Defense), CIFR RF power, mMimo, and/or like products. Moreover, aspects of the disclosure may be implemented in any application with a two stage amplifier that uses wire-bonds for interconnects.

FIG. 1 illustrates a perspective view of a package according to the disclosure.

Figure 2:
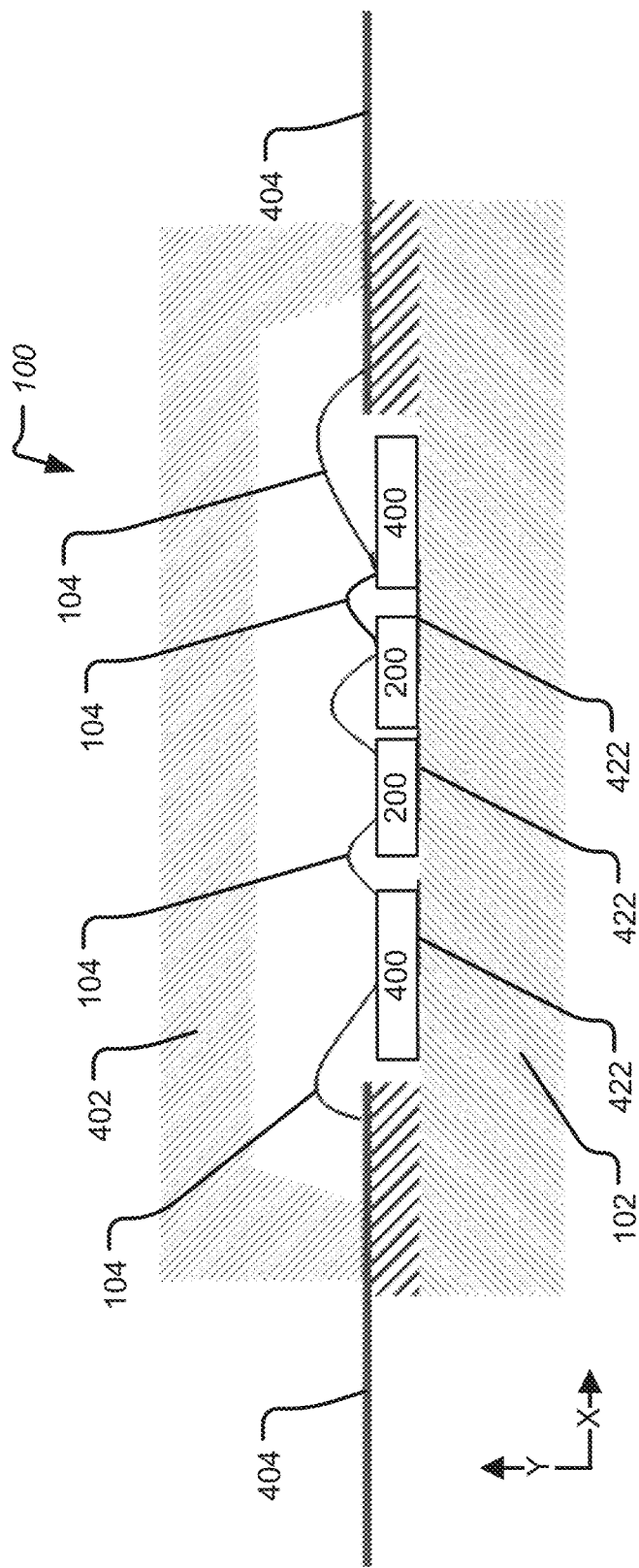
FIG. 2 illustrates a cross-sectional view of the package according to FIG. 1.

FIG. 2 illustrates a cross-sectional view of the package according to FIG. 1.

The aspects of FIG. 1 and FIG. 2 may include any one or more features as described herein. In particular, FIG. 1 and FIG. 2 show an exemplary implementation of a package 100 that may include any one or more other features, components, arrangements, and the like as described herein. In particular, FIG. 1 and FIG. 2 show the package 100 that may be implemented as a RF package, a RF amplifier package, a RF power amplifier package, a RF power transistor package, a RF power amplifier transistor package, and/or the like as described herein.

The package 100 may include one or more semiconductor devices 400, a support 102, and at least one or more of an IPD component 200. In aspects, the package 100 may include a plurality of the IPD component 200; and in aspects the package 100 may include a single implementation of IPD component 200. In aspects, the IPD component 200 may be implemented as an IPD and may be implemented as a SiC IPD component, an IPD component having a SiC substrate, and/or the like. In aspects, the package 100 may not implement the IPD component 200. In aspects, the package 100 may implement a functionality of the IPD component 200 in other components.

The IPD component 200 may be implemented as at least part of a RF device as described herein. The IPD component 200 may implement interstage matching, interstage matching functions, matching networks, harmonic termination circuitry, integrated passive devices (IPD), capacitors, resistors, inductors, and/or the like.

In aspects, the IPD component 200 may be used for matching networks, interstage matching, pre-matching, bias-decoupling, thermal-grounding, and/or the like in RF power products and/or the like. The IPD component 200 may be placed inside a package, such as an open cavity package or over-mold package, together with transistor die, such as Gallium nitride (GaN) transistor die, and other capacitors, IPDs, and/or the like and connected with wire bonds to each other and to package leads. The one or more semiconductor devices 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

The package 100 may be implemented to include an open cavity configuration suitable for use with the IPD component 200 of the disclosure. In particular, the open cavity configuration may utilize an open cavity package design. In some aspects, the open cavity configuration may include a lid or other enclosure for protecting interconnects, circuit components, the IPD component 200, the one or more semiconductor devices 400, and/or the like. The package 100 may include a ceramic body 402 and one or more metal contacts 404.

Inside the package 100, the one or more semiconductor devices 400 may be attached to the support 102 via a die attach material 422. One or more interconnects 104 may couple the one or more semiconductor devices 400 to a first one of the one or more metal contacts 404, a second one of the one or more metal contacts 404, the IPD component 200, and and/or the like. Additionally, inside the package 100, the IPD component 200 may be arranged on the support 102 via a die attach material 422 with the one or more interconnects 104 shown in an exemplary configuration that may connect between the package 100, the IPD component 200, and/or the one or more semiconductor devices 400. The support 102 may dissipate the heat generated by the one or more semiconductor devices 400 and the IPD component 200 while simultaneously isolating and protecting the one or more semiconductor devices 400 and the IPD component 200 from the outside environment. In aspects, the die attach material 422 may utilize an adhesive, soldering, sintering, eutectic bonding, thermal compression bonding, ultrasonic bonding/welding, a clip component, and/or the like as described herein.

The one or more interconnects 104 may utilize ball bonding, wedge bonding, compliant bonding, ribbon bonding, metal clip attach, a trace, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to a plurality of interconnect pads of components of the package 100 by an adhesive, soldering, sintering, eutectic bonding, thermal compression bonding, ultrasonic bonding/welding, a clip component, and/or the like as described herein.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Figure 3:
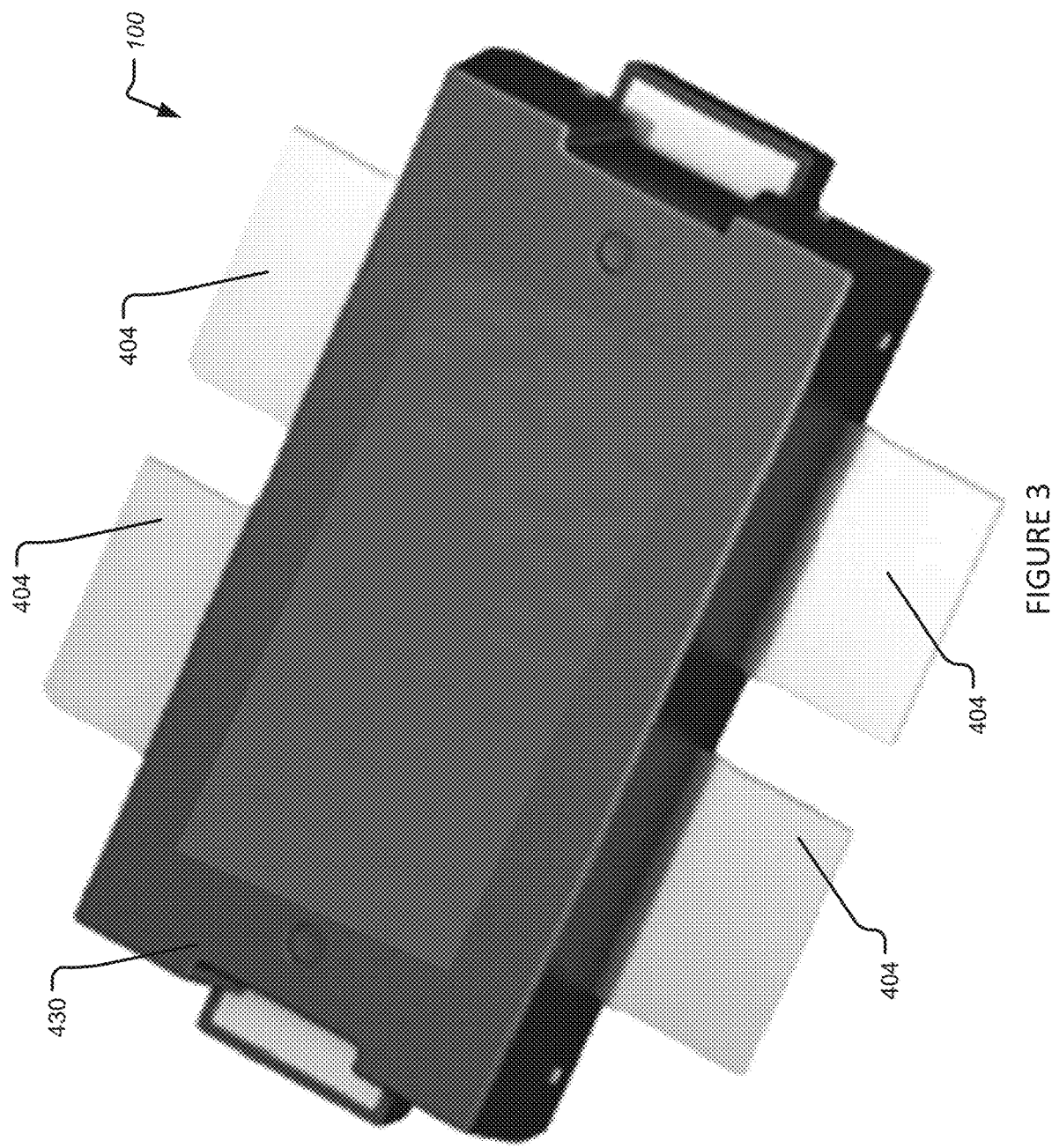
FIG. 3 illustrates a perspective view of a package according to the disclosure.

FIG. 3 illustrates a perspective view of a package according to the disclosure.

Figure 4:
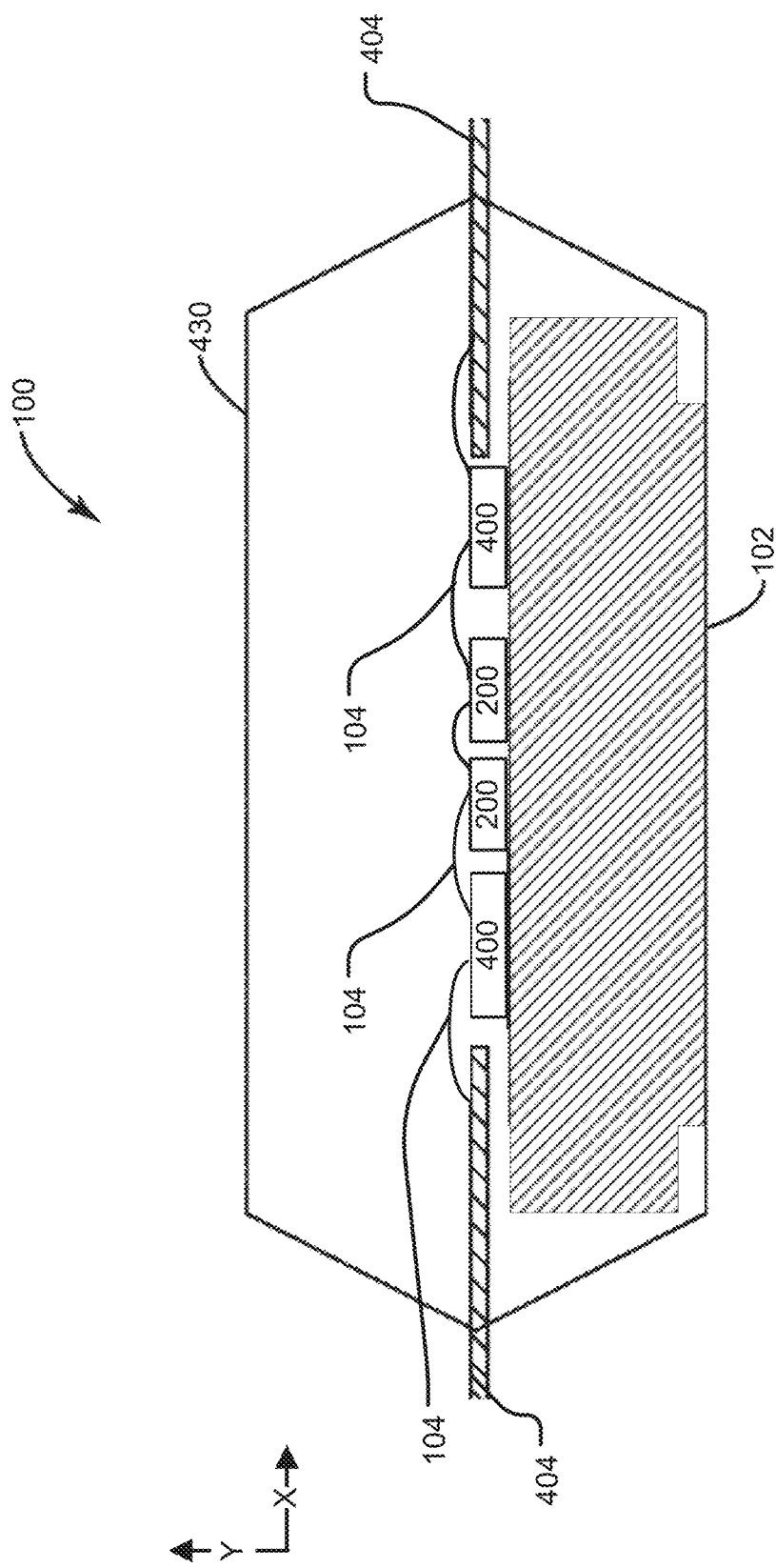
FIG. 4 illustrates a cross-sectional view of the package according to FIG. 5.
Figure 5:
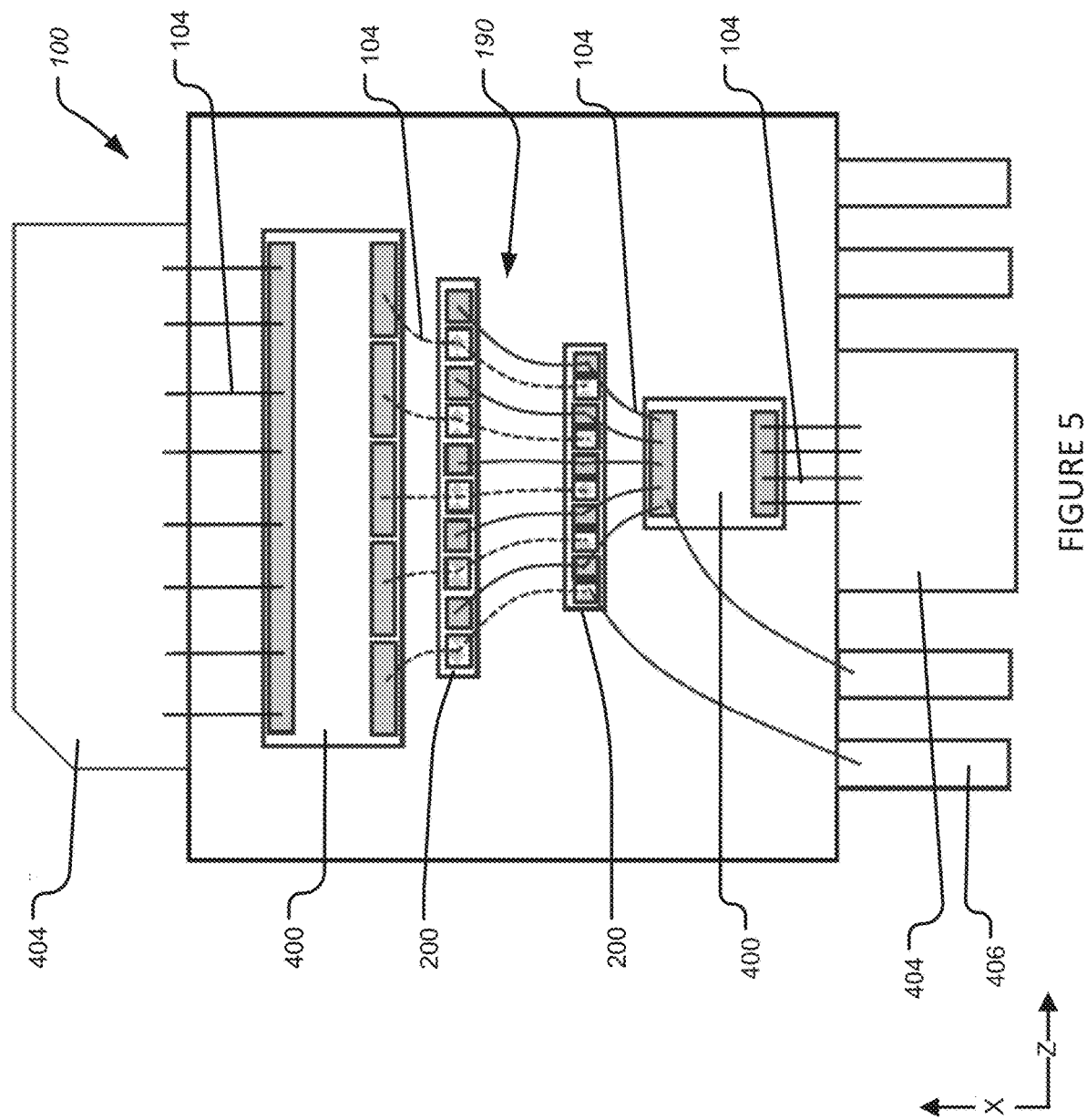
FIG. 5 illustrates a partial top view of the package according to a particular aspect of the disclosure.

FIG. 4 illustrates a cross-sectional view of the package according to FIG. 5.

In particular, FIG. 3 and FIG. 4 show another exemplary implementation of the package 100 that may include any one or more other features, components, arrangements, and the like as described herein. In particular, FIG. 3 and FIG. 4 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the IPD component 200, and/or the like.

Additionally, inside the package 100, the IPD component 200 may be arranged on the support 102 as described herein with the one or more interconnects 104 shown in an exemplary configuration. Moreover, inside the package 100, the IPD component 200 and may be arranged on the support 102. The package 100 may include an over-mold 430, one or more metal contacts 404 such as one or more input/output pins, and the support 102. The over-mold 430 may substantially surround the one or more semiconductor devices 400 and/or the IPD component 200, which are mounted on the support 102 using a die attach material. The over-mold 430 may be formed of a plastic or a plastic polymer compound, which may be injection molded around the support 102, the one or more semiconductor devices 400 and/or the IPD component 200, and/or the like, thereby providing protection from the outside environment. The one or more semiconductor devices 400, the IPD component 200 may be coupled to the one or more metal contacts 404 via the one or more interconnects 104.

The one or more interconnects 104 may connect to a plurality of interconnect pads of the components of the package 100. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

In one aspect, the over-mold configuration may substantially surround the one or more semiconductor devices 400, the IPD component 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the IPD component 200, and/or the like, thereby providing protection for the IPD component 200, the one or more semiconductor devices 400, and other components of the package 100 from the outside environment.

The package 100 may be implemented as an RF package and the IPD component 200 may be implemented as a radio frequency device that may include, connect, support, or the like a transmitter, transmitter functions, a receiver, receiver functions, a transceiver, transceiver functions, matching network functions, interstage matching, interstage matching functions, harmonic termination circuitry, integrated passive devices (IPD), and the like. The IPD component 200 implemented as a radio frequency device may be configured to, may support, or the like transmitting a radio wave and modulating that wave to carry data with allowable transmitter power output, harmonics, and/or band edge requirements. The IPD component 200 may be implemented as a radio frequency device may be configured to, may support, or the like receiving a radio wave and demodulating the radio wave. The IPD component 200 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

FIG. 5 illustrates a partial top view of the package according to a particular aspect of the disclosure.

Figure 6:
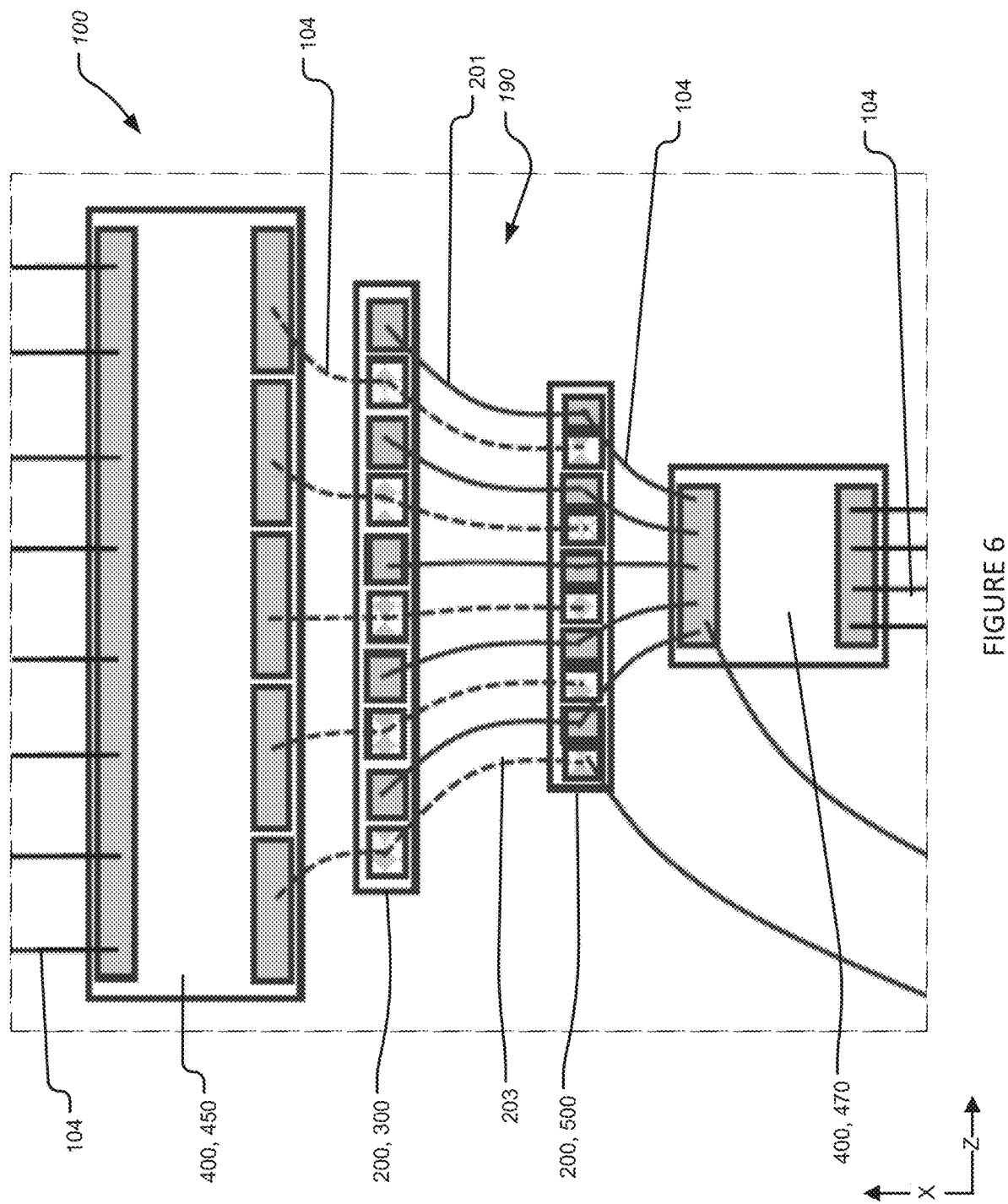
FIG. 6 illustrates a further partial top view of the package according to FIG. 5.

FIG. 6 illustrates a further partial top view of the package according to FIG. 5.

Figure 7:
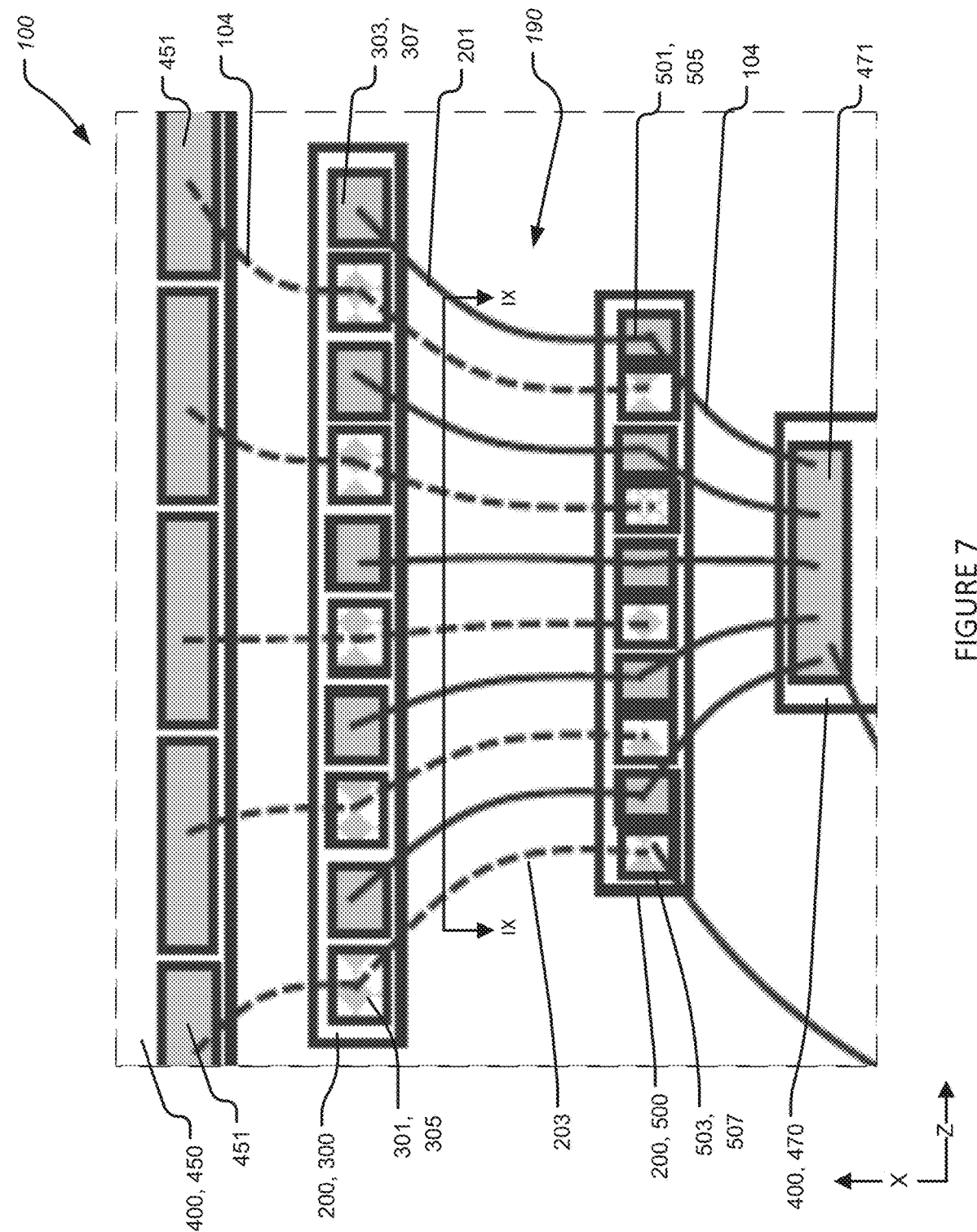
FIG. 7 illustrates a further partial top view of the package according to FIG. 5.

FIG. 7 illustrates a further partial top view of the package according to FIG. 5.

Figure 8:
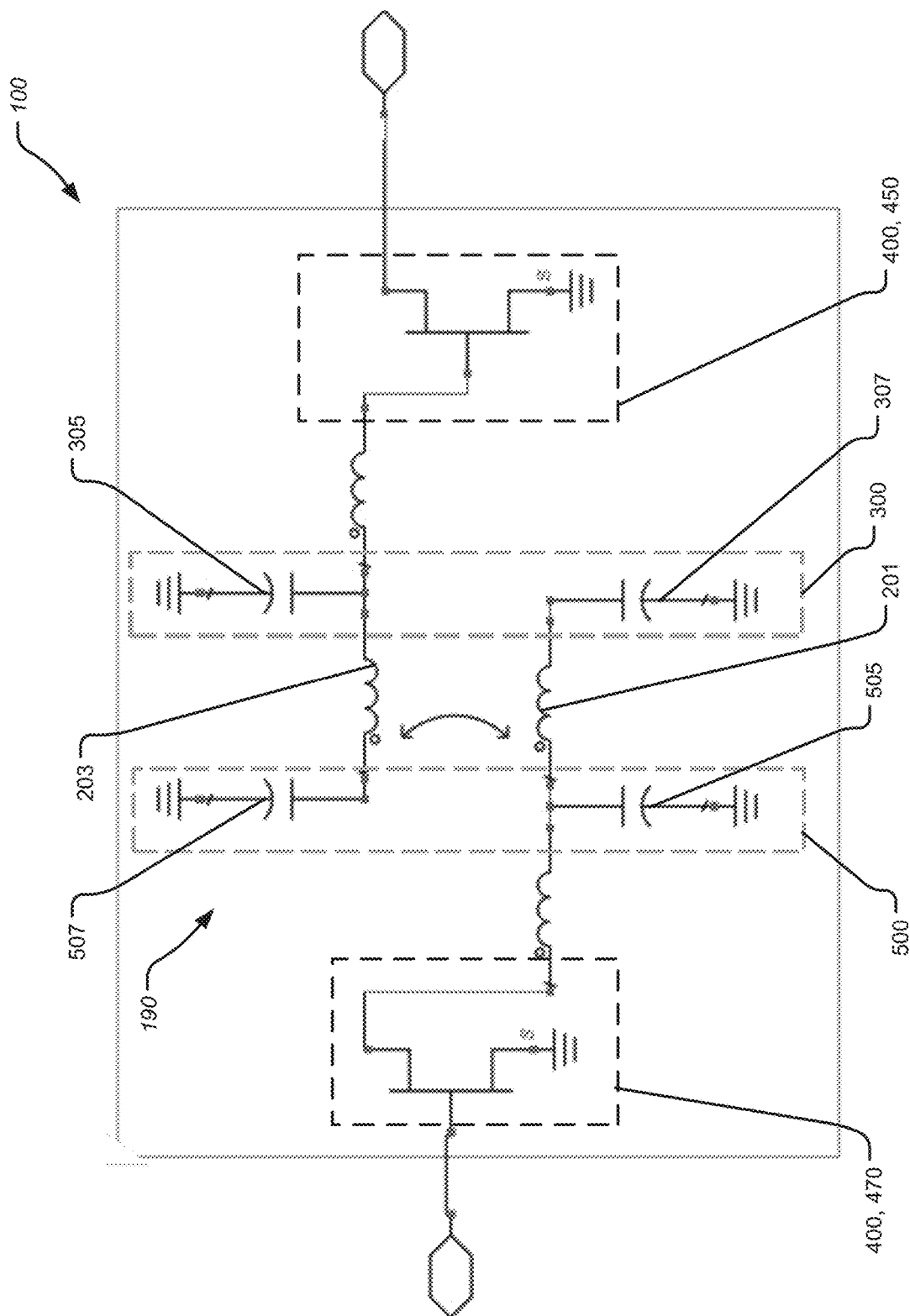
FIG. 8 illustrates an equivalent circuit schematic of the package according to FIG. 5.

FIG. 8 illustrates an equivalent circuit schematic of the package according to FIG. 5.

In particular, FIG. 5 shows exemplary implementation of the package 100 that may include any one or more other features, components, arrangements, and the like as described herein. Referring to FIG. 5, the package 100 may include a plurality of the one or more semiconductor devices 400 and/or a plurality of the IPD component 200. In particular, the arrangement of the plurality of the one or more semiconductor devices 400 and/or the plurality of the IPD component 200 is merely exemplary. In aspects, the package 100 may include any number of the one or more semiconductor devices 400 and any number of the IPD component 200. In one aspect, the IPD component 200 may be configured to attach to the support 102 illustrated in FIG. 2 and/or FIG. 4. In one aspect, the IPD component 200 may be configured to directly attach to the support 102.

As further described herein, one or more implementations of the IPD component 200 together with associated interconnects may form a transformer, an RF coupling device, a device for coupling the plurality of the one or more semiconductor devices 400, and/or the like, which hereinafter is referred to as a transformer 190 for brevity.

As further illustrated in FIG. 6, the one or more semiconductor devices 400 may connect to one or more implementations of the IPD component 200 with the one or more interconnects 104. In a particular aspect, a first device implementation 470 of the one or more semiconductor devices 400 may connect to a first IPD implementation 500 of the IPD component 200 with the one or more interconnects 104; and a second device implementation 450 of the one or more semiconductor devices 400 may connect to a second IPD implementation 300 of the IPD component 200 with the one or more interconnects 104.

The package 100 may implement an arrangement of wire bonds and capacitors to function as an interstage match. In one aspect, the package 100 may implement an arrangement of wire bonds and capacitors to function as an interstage match together with the second IPD implementation 300 and/or the first IPD implementation 500. For example, the package 100 may implement an arrangement of wire bonds and capacitors to function as an interstage match to provide improved matching from an output of the one or more semiconductor devices 400, such as a driver stage transistor, to an input of another implementation of the one or more semiconductor devices 400, such as a final stage transistor. In one aspect, the first device implementation 470 may be implemented as a driver stage transistor; and the second device implementation 450 may be implemented as a final stage transistor.

With further reference to FIG. 6, the first IPD implementation 500 may connect to the second IPD implementation 300 with a set of primary interconnects 201; and the first IPD implementation 500 may connect to the second IPD implementation 300 with a set of secondary interconnects 203. The set of primary interconnects 201 and the set of secondary interconnects 203 may be wires, bond wires, leads, and/or the like interconnects as described herein.

The set of secondary interconnects 203 and/or the set of primary interconnects 201 may utilize ball bonding, wedge bonding, compliant bonding, ribbon bonding, metal clip attach, a trace, and/or the like. In one aspect, the set of secondary interconnects 203 and/or the set of primary interconnects 201 may utilize the same type of connection. In one aspect, the set of secondary interconnects 203 and/or the set of primary interconnects 201 may utilize different types of connections.

The set of secondary interconnects 203 and/or the set of primary interconnects 201 may be include various metal materials including one or more of aluminum, copper, silver, gold, and/or the like. In one aspect, the set of secondary interconnects 203 and/or the set of primary interconnects 201 may utilize the same type of metal. In one aspect, the set of secondary interconnects 203 and/or the set of primary interconnects 201 may utilize different types of metal. The set of secondary interconnects 203 and/or the set of primary interconnects 201 may connect to a plurality of interconnect pads of components of the package 100 by an adhesive, soldering, sintering, eutectic bonding, thermal compression bonding, ultrasonic bonding/welding, a clip component, and/or the like as described herein.

In aspects, the package 100 may implement use of RF signal coupling from one set of wires (primary set) to another set of wires (secondary set) to transfer a signal from the one or more semiconductor devices 400, such as the driver stage, to another implementation of the one or more semiconductor devices 400, such as the final stage. In one aspect, the package 100 may implement use of RF signal coupling from the set of primary interconnects 201 to the set of secondary interconnects 203 to transfer a signal from the one or more semiconductor devices 400, such as the driver stage, to another implementation of the one or more semiconductor devices 400, such as the final stage. In one aspect, the package 100 may implement use of RF signal coupling from the set of primary interconnects 201 to the set of secondary interconnects 203 in conjunction with implementations of the IPD component 200 to transfer a signal from the one or more semiconductor devices 400, such as the driver stage, to another implementation of the one or more semiconductor devices 400, such as the final stage. In aspects, the RF signal is coupled through the air by the set of primary interconnects 201 and the set of secondary interconnects 203 as an electromagnetic coupling, an electromagnetic field, electromagnetic energy, and/or the like and accordingly there is no need for a physical connection to transfer a signal from the one or more semiconductor devices 400, such as the driver stage, to another implementation of the one or more semiconductor devices 400, such as the final stage.

In this regard, the package 100 may operate similar to a principle on which a transformer operates. For example, a transformer may typically transfer energy between windings and a core. However, the package 100 may be configured such that an equivalent functionality of the windings of the transformer may be implemented by the set of primary interconnects 201 and the set of secondary interconnects 203, and an equivalent functionality of the core of the transformer may be implemented by the air, a dielectric, and/or the like surrounding the set of primary interconnects 201 and the set of secondary interconnects 203. In this regard, the package 100 may be configured to implement the transformer 190 with one or more of implementations of the IPD component 200, the set of primary interconnects 201, the set of secondary interconnects 203, and/or the like.

In aspects, a transformer principle may be used by the package 100 that may be configured to implement the transformer 190 with one or more of implementations of the IPD component 200, the set of primary interconnects 201, the set of secondary interconnects 203, and/or the like to interstage match and create a high-pass frequency response that suppresses low frequency gain. In a transformer, varying AC current in the primary winding creates a varying magnetic flux which induces a varying voltage in the secondary winding. At low frequencies and DC, the input of the transformer 190 with one or more of implementations of the IPD component 200, the set of primary interconnects 201, the set of secondary interconnects 203, and/or the like is isolated by the transformer 190, which only works effectively at high frequency, thus the transformer 190 forms a high-pass network. This configuration effectively reduces and suppresses both the maximum available gain and the forward voltage gain bump at low frequencies. By effectively suppressing the maximum available gain at low frequencies, the package 100 may show low gain at low frequencies even when the source or load impedance is randomly mismatched. The transformer 190 described herein can improve the ruggedness, stability and linearization ability of an amplifier.

In this regard, the package 100 may be configured such that a RF signal is coupled through the air by the transformer 190 and accordingly there is no need for a physical connection between implementations of the one or more semiconductor devices 400, such as the driver stage and final stage. In aspects, the RF signal is coupled through the air by the transformer 190 as an electromagnetic coupling, an electromagnetic field, electromagnetic energy, and/or the like and accordingly there is no need for a physical connection between implementations of the one or more semiconductor devices 400, such as the driver stage and final stage. More specifically, the package 100 may be configured such that a RF signal is coupled through the air surrounding the set of primary interconnects 201 and the set of secondary interconnects 203, a dielectric surrounding the set of secondary interconnects 203, the set of primary interconnects 201, and/or the like and accordingly there is no need for a physical connection between implementations of the one or more semiconductor devices 400, such as the driver stage and final stage. In aspects, no physical connection between the set of primary interconnects 201 and the set of secondary interconnects 203 means that the set of primary interconnects 201 and the set of secondary interconnects 203 are not electrically connected directly or indirectly. In aspects, no physical connection between the set of primary interconnects 201 and the set of secondary interconnects 203 means that the set of primary interconnects 201 and the set of secondary interconnects 203 are not physically directly connected. In aspects, no physical connection between the set of primary interconnects 201 and the set of secondary interconnects 203 means that the set of primary interconnects 201 and the set of secondary interconnects 203 are electrically isolated.

Additionally, this configuration of the package 100 may include some protective benefits for the one or more semiconductor devices 400. In this regard, physical wire connections that directly connect implementations of the one or more semiconductor devices 400 may undesirably transfer high voltage, high current, high power, and/or the like therebetween. However, coupling the RF signal utilizing one or more of implementations of the IPD component 200, the set of primary interconnects 201, the set of secondary interconnects 203, the transformer 190, and/or the like may isolate and reduce transfer of high voltage, high current, high power, and/or the like between implementations of the one or more semiconductor devices 400.

Additionally, implementation of the package 100 may result in their being no need for a DC block between implementations of the one or more semiconductor devices 400 that may include a driver stage and a final stage. In particular, coupling the RF signal utilizing one or more of implementations of the IPD component 200, the set of primary interconnects 201, the set of secondary interconnects 203, the transformer 190, and/or the like negate the need for the DC block because DC and a low frequency signal cannot couple through the air.

In this regard, the disclosed implementation of the package 100 implementing coupling of the RF signal utilizing one or more of implementations of the IPD component 200, the set of primary interconnects 201, the set of secondary interconnects 203, the transformer 190, and/or the like may result in an unwanted low frequency signal being attenuated. In particular, the disclosed implementation of the package 100 implementing coupling of the RF signal utilizing one or more of implementations of the IPD component 200, the set of primary interconnects 201, the set of secondary interconnects 203, the transformer 190, and/or the like attenuates and/or filters lower frequency signal from being transferred between the various implementations of the one or more semiconductor devices 400. In this regard, implementations of the IPD component 200, the set of primary interconnects 201, the set of secondary interconnects 203, the transformer 190, and/or the like may form a filter, a low frequency filter, and/or the like.

Additionally, the disclosed implementation of the package 100 may be implemented such that a desired RF signal may be effectively coupled through the transformer 190 implemented by the IPD component 200, the set of primary interconnects 201, the set of secondary interconnects 203, and/or the like, and may provide a more stable two-stage amplifier. In particular, the disclosed implementation of the package 100 implementing coupling of the RF signal utilizing one or more of implementations of the IPD component 200, the set of primary interconnects 201, the set of secondary interconnects 203, the transformer 190, and/or the like stabilizes the various implementations of the one or more semiconductor devices 400 that may be implemented as a two-stage amplifier by the package 100.

Additionally, implementation of the package 100 implementing coupling of the RF signal utilizing one or more of implementations of the IPD component 200, the set of primary interconnects 201, the set of secondary interconnects 203, the transformer 190, and/or the like may not need a series capacitor and/or a DC block between the implementations of the one or more semiconductor devices 400, such as the driver stage and final stage. In particular, the package 100 implementing coupling of the RF signal utilizing one or more of implementations of the IPD component 200, the set of primary interconnects 201, the set of secondary interconnects 203, the transformer 190, and/or the like may form a physical separation between the implementations of the one or more semiconductor devices 400, such as the driver stage transistor die and the final stage transistor die. In particular, the disclosed implementation of the package 100 may implement an electrical connection between driver stage and final stage through coupling of a RF signal from one set of bond wires (primary set) that may be implemented by the set of primary interconnects 201 to another set of bond wires (secondary set) that may be implemented by the set of secondary interconnects 203.

Since higher frequency signals may couple more effectively from wire bonds and/or to wire bonds than lower frequency signals, implementations of the transformer 190 based interstage of the package 100 implementing coupling of the RF signal utilizing one or more of implementations of the IPD component 200, the set of primary interconnects 201, the set of secondary interconnects 203, and/or the like may automatically attenuate low frequency signals as well as DC. This may result in keeping the two-stage transistor implementations of the one or more semiconductor devices 400 of the package 100 stable. Typically, transistor gain at low frequencies is very high, and putting two high gain stages together, leads to stability and oscillation problems. The disclosed implementation of the package 100 implementing coupling of the RF signal utilizing one or more of implementations of the IPD component 200, the set of primary interconnects 201, the set of secondary interconnects 203, the transformer 190, and/or the like may provide inherent damping of low frequency signals. In this regard, the inherent damping of low frequency signals may control and/or limit a low frequency gain of the one or more semiconductor devices 400, such as a two-stage amplifier implementation of the one or more semiconductor devices 400, and may keep the package 100 and/or the one or more semiconductor devices 400 stable.

The transformer 190 based topology implemented by the package 100 implementing coupling of the RF signal utilizing one or more of implementations of the IPD component 200, the set of primary interconnects 201, the set of secondary interconnects 203, and/or the like may be more broadband than the typical prior art topology using shunt inductance and/or series capacitance. In this regard, the disclosed implementation of the package 100 implementing coupling of the RF signal utilizing one or more of implementations of the IPD component 200, the set of primary interconnects 201, the set of secondary interconnects 203, the transformer 190, and/or the like may provide impedance transformation. In particular, impedance transformation may be achieved in the transformer 190 configured utilizing one or more of implementations of the IPD component 200, the set of primary interconnects 201, the set of secondary interconnects 203, and/or the like by adjusting a ratio of primary to secondary wires, such as a ratio of the set of primary interconnects 201 and the set of secondary interconnects 203. In this regard, a ratio of the set of primary interconnects 201 and the set of secondary interconnects 203 may be a number of primary bond wires to secondary bond wires, a size of the primary bond wires to a size of the secondary bond wires, a width of the primary bond wires to a width of the secondary bond wires, a diameter of the primary bond wires to a diameter of the secondary bond wires, and/or the like. For example, a 50 to 5 ohm impedance transformation (10:1 impedance ratio) can be achieved by having ten secondary wires to every one primary wire. Accordingly, the disclosed implementation of the package 100 utilizing one or more of implementations of the IPD component 200, the set of primary interconnects 201, the set of secondary interconnects 203, the transformer 190, and/or the like may provide a much broader band impedance matching than a device implementing a L-C network match. Thus, implementations of the package 100 implementing the transformer 190 based interstage utilizing one or more of implementations of the IPD component 200, the set of primary interconnects 201, the set of secondary interconnects 203, and/or the like may be used to implement wider band two-stage amplifiers.

In aspects of the disclosure, the package 100 may be implemented such that the wire bonds leading from the one or more semiconductor devices 400, such as the driver die, to another implementation of the one or more semiconductor devices 400, such as the final die, can be designed to fan out. This configuration of the package 100 may be useful because some implementations of the one or more semiconductor devices 400, such as the final stage die, may be typically 5-7 times larger than other implementations of the one or more semiconductor devices 400, such as the driver die. Accordingly, implementations of the package 100 may implement a fan-out design that may more naturally fit from a driver die (smaller periphery and physical size) implementation of the one or more semiconductor devices 400 to final die (larger periphery and physical size) implementation of the one or more semiconductor devices 400. In this regard, without a fan out approach implemented by the package 100, there may be some step mismatch in the two-stage amplifier design of the package 100, which may limit bandwidth.

In particular aspects, FIG. 6 illustrates an implementation of the package 100 with an exemplary fanout configuration of interconnects, such as wire bonds. In this regard, a fanout configuration of interconnects may include interconnects extending in nonparallel directions, interconnects extending in more than one direction, interconnects in varied directions, interconnects extending in multiple directions, and/or the like. In particular, the one or more interconnects 104 connecting the first device implementation 470 to the first IPD implementation 500 may fanout along the Z axis and the X axis. More specifically, the one or more interconnects 104 connecting the first device implementation 470 to the first IPD implementation 500 may not be parallel and connection points of the one or more interconnects 104 on the first device implementation 470 may be spaced closer than the connection points of the one or more interconnects 104 on the first IPD implementation 500. In particular aspects, the one or more interconnects 104 connecting the second IPD implementation 300 to the second device implementation 450 may fanout along the Z axis and the X axis. More specifically, the one or more interconnects 104 connecting the second IPD implementation 300 to the second device implementation 450 may not be parallel and connection points of the one or more interconnects 104 on the second IPD implementation 300 may be spaced closer than the connection points of the one or more interconnects 104 on the second device implementation 450. In particular aspects, the set of primary interconnects 201 and the set of secondary interconnects 203 connecting the first IPD implementation 500 to the second IPD implementation 300 may fanout along the Z axis and the X axis. More specifically, the set of primary interconnects 201 and the set of secondary interconnects 203 connecting the first IPD implementation 500 to the second IPD implementation 300 may not be parallel and connection points of the set of primary interconnects 201 and the set of secondary interconnects 203 on the first IPD implementation 500 may be spaced closer than the connection points of the set of primary interconnects 201 and the set of secondary interconnects 203 on the second IPD implementation 300.

In one aspect, the one or more semiconductor devices 400 may configured as a final stage transistor die. In one aspect, the second device implementation 450 may configured as a final stage transistor die. In one aspect, the one or more semiconductor devices 400 may be configured as a driver stage transistor die. In one aspect, the first device implementation 470 may be configured as a driver stage transistor die. However, the one or more semiconductor devices 400, the first device implementation 470, and/or the second device implementation 450 may be implemented for other functionality.

With reference to FIG. 7, in aspects the second device implementation 450 may include one or more interconnect pads 451. The one or more interconnect pads 451 may be arranged on the second device implementation 450 and provide a location for the one or more interconnects 104 extending from the second IPD implementation 300 to connect to the second device implementation 450. In aspects, there may be a single implementation of the one or more interconnect pads 451 in or on the second device implementation 450. In aspects there may be a plurality of the one or more interconnect pads 451 in or on the second device implementation 450.

In aspects, the second IPD implementation 300 may include one or more interconnect pads 301. The one or more interconnect pads 301 may be arranged on the second IPD implementation 300 and provide a location for the one or more interconnects 104 extending from the second device implementation 450 to connect to the second IPD implementation 300. In aspects, there may be a single implementation of the one or more interconnect pads 301 in or on the second IPD implementation 300. In aspects there may be a plurality of the one or more interconnect pads 301 in or on the second IPD implementation 300.

In aspects, the first device implementation 470 may include one or more interconnect pads 471. The one or more interconnect pads 471 may be arranged on the first device implementation 470 and provide a location for the one or more interconnects 104 extending from the first IPD implementation 500 to connect to the first device implementation 470. In aspects, there may be a single implementation of the one or more interconnect pads 471 in or on the first device implementation 470. In aspects there may be a plurality of the one or more interconnect pads 471 in or on the first device implementation 470.

In aspects, the first IPD implementation 500 may include one or more interconnect pads 501. The one or more interconnect pads 501 may be arranged on the first IPD implementation 500 and provide a location for the one or more interconnects 104 extending from the first device implementation 470 to connect to the first IPD implementation 500. In aspects, there may be a single implementation of the one or more interconnect pads 501 in or on the first IPD implementation 500. In aspects there may be a plurality of the one or more interconnect pads 501 in or on the first IPD implementation 500.

In aspects, the second IPD implementation 300 may include one or more interconnect pads 303. The one or more interconnect pads 303 may be arranged on the second IPD implementation 300 and provide a location for the set of primary interconnects 201 extending from the first IPD implementation 500 to connect to the second IPD implementation 300. In aspects, there may be a single implementation of the one or more interconnect pads 303 in or on the second IPD implementation 300. In aspects there may be a plurality of the one or more interconnect pads 303 in or on the second IPD implementation 300.

In aspects, the one or more interconnects 104 may extend from the one or more interconnect pads 471 of the first device implementation 470 to the one or more interconnect pads 501 of the first IPD implementation 500. In aspects, the set of primary interconnects 201 may extend from the one or more interconnect pads 501 of the first IPD implementation 500 to the one or more interconnect pads 303 of the second IPD implementation 300 and may terminate on the second IPD implementation 300. In aspects, the set of secondary interconnects 203 originate at and may be connected to one or more interconnect pads 503 of the first IPD implementation 500 and the one or more interconnects 104 may connect on the one or more interconnect pads 301 of the second IPD implementation 300 to the one or more interconnect pads 451 of the second device implementation 450.

In aspects, as illustrated in FIG. 7, the first IPD implementation 500 may include an inter-digitated array of the one or more interconnect pads 501 and the one or more interconnect pads 503. In aspects, the one or more interconnect pads 501 may connect to one or more capacitors to ground such as the support 102; and the one or more interconnect pads 503 may connect to one or more capacitors to ground such as the support 102. In aspects, each of the one or more interconnect pads 501 may connect to a capacitor to ground such as the support 102; and each of the one or more interconnect pads 503 may connect to a capacitor to ground such as the support 102. Accordingly, the first IPD implementation 500 may form an inter-digitated capacitor array of capacitors each associated with the one or more interconnect pads 501 and/or the one or more interconnect pads 503.

In aspects, the first IPD implementation 500 may be configured with one or more capacitors with at least one capacitor of the first IPD implementation 500 connected to the one or more interconnect pads 503 and ground such as the support 102; and at least one capacitor of the first IPD implementation 500 connected to the one or more interconnect pads 501 and ground such as the support 102.

In aspects, the second IPD implementation 300 may be configured with one or more capacitors with at least one capacitor of the second IPD implementation 300 connected to the one or more interconnect pads 303 and ground such as the support 102; and at least one capacitor of the second IPD implementation 300 connected to the one or more interconnect pads 301 and ground such as the support 102. In aspects, the one or more interconnect pads 303 may connect to one or more capacitors to ground such as the support 102; and the one or more interconnect pads 301 may connect to one or more capacitors to ground such as the support 102.

In aspects, each of the one or more interconnect pads 301 may connect to a capacitor to ground such as the support 102; and each of the one or more interconnect pads 303 may connect to a capacitor to ground such as the support 102. In aspects, the one or more interconnect pads 301 may connect to one or more capacitors to ground such as the support 102; and the one or more interconnect pads 303 may connect to one or more capacitors to ground such as the support 102.

In one aspect, the IPD component 200, the second IPD implementation 300, and/or the first IPD implementation 500 may configured as an inter-digitated capacitor array. In this regard, as illustrated in FIG. 7, the second IPD implementation 300 may include an inter-digitated array of the one or more interconnect pads 301 and the one or more interconnect pads 303. In aspects, the one or more interconnect pads 301 may connect to a capacitor 305 to ground such as the support 102 as illustrated in FIG. 8; and the one or more interconnect pads 303 may connect to a capacitor 307 to ground such as the support 102 as illustrated in FIG. 8. In aspects, the one or more interconnect pads 301 may each connect to a capacitor 305 to ground such as the support 102; and the one or more interconnect pads 303 may each connect to a capacitor 307 to ground such as the support 102 as illustrated in FIG. 8. Accordingly, the second IPD implementation 300 may form an inter-digitated capacitor array of capacitors each associated with the one or more interconnect pads 301 and/or the one or more interconnect pads 303. In this regard, there may be a single implementation of the capacitor 305 or a plurality of implementations of the capacitor 305; and there may be a single implementation of the capacitor 307 or a plurality of implementations of the capacitor 307.

Additionally, as illustrated in FIG. 7, the first IPD implementation 500 may include an inter-digitated array of the one or more interconnect pads 501 and the one or more interconnect pads 503. Moreover, in aspects, the one or more interconnect pads 501 may connect to a capacitor 505 to ground such as the support 102 as illustrated in FIG. 8; and the one or more interconnect pads 503 may connect to a capacitor 507 to ground such as the support 102 as illustrated in FIG. 8. In aspects, the one or more interconnect pads 501 may each connect to a capacitor 505 to ground such as the support 102; and the one or more interconnect pads 503 may each connect to a capacitor 507 to ground such as the support 102 as illustrated in FIG. 8. In this regard, there may be a single implementation of the capacitor 505 or a plurality of implementations of the capacitor 505; and there may be a single implementation of the capacitor 507 or a plurality of implementations of the capacitor 507. Accordingly, the first IPD implementation 500 may form an inter-digitated capacitor array of capacitors each associated with the one or more interconnect pads 501 and/or the one or more interconnect pads 503.

In some aspects, implementations of the one or more semiconductor devices 400 may be sized differently. For example, an implementation of the one or more semiconductor devices 400 such as the final stage die may be 4-7 times larger in size and periphery than an implementation of the one or more semiconductor devices 400 such as the driver. An input impedance of the final stage die may be matched to an output impedance of the driver stage die such that the two-stage amplifier has a desired or required gain and gain-flatness over the bandwidth of the amplifier of the package 100.

This matching may be implemented by the coupled wire bond interstage match implementing the first IPD implementation 500 as a first interdigitated capacitor array, the second IPD implementation 300 as a second interdigitated capacitor array, and an arrangement of primary and secondary wire bonds such as the set of primary interconnects 201 and the set of secondary interconnects 203.

The one or more interconnects 104 and the set of primary interconnects 201 may connect the RF signal from the first device implementation 470 to primary capacitors on the interdigitated capacitor array implementation of the first IPD implementation 500 and the second IPD implementation 300. The one or more interconnects 104 may connect the RF signal from the secondary capacitors on the second IPD implementation 300 to the second device implementation 450, such as the final stage transistor die. The set of primary interconnects 201 and the set of secondary interconnects 203 may be physically separated from each other, but electrically coupled to each other at RF frequencies. Similarly, the primary capacitors and the secondary capacitors of the first IPD implementation 500 and the second IPD implementation 300 may be physically interdigitated onto a same chip of the second IPD implementation 300 and the first IPD implementation 500, but electrically isolated from each other.

In aspects, there may be an increase in chip size going from the first device implementation 470, such as a driver die, to the first IPD implementation 500, the second IPD implementation 300, and the second device implementation 450. So the one or more interconnects 104, the set of primary interconnects 201, the set of secondary interconnects 203, and/or the like such as wire bonds, may fan-out as the chip size gets larger. The package 100 may implement the one or more metal contacts 404 as leads for RF input and RF output, as well as DC pins 406 for the DC drain voltage of the one or more semiconductor devices 400 and/or the first device implementation 470, such as a driver die and DC gate voltage of the one or more semiconductor devices 400 and/or the second device implementation 450, such as the final die. Gate voltage to the final die can be fed through the secondary wire set.

FIG. 8 illustrates an equivalent circuit schematic of the package 100 and includes equivalent circuit portions for the first IPD implementation 500, the second IPD implementation 300, and/or the like.

Figure 9:
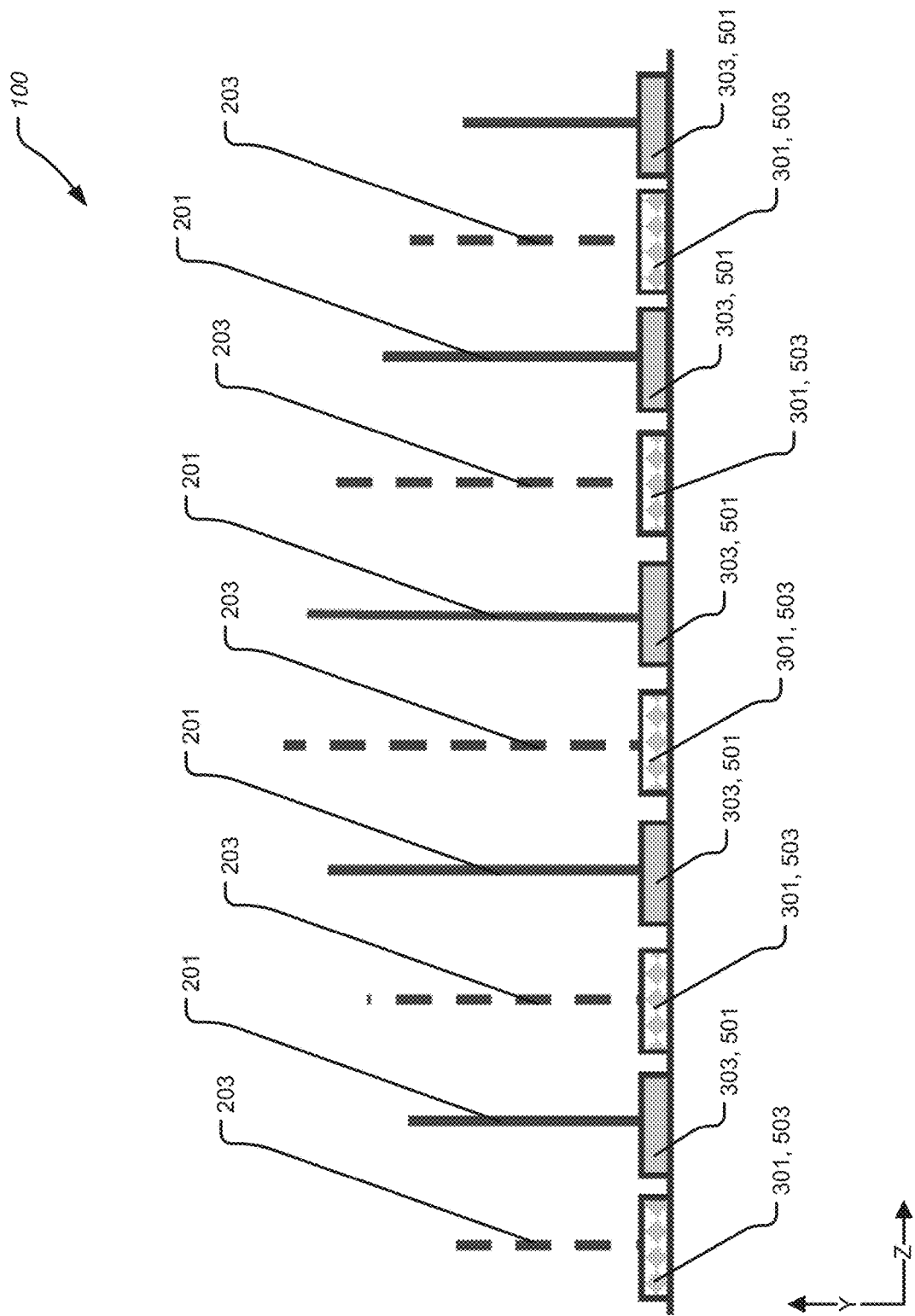
FIG. 9 illustrates an exemplary wire heights according to aspects of the disclosure.

FIG. 9 illustrates an exemplary wire heights according to aspects of the disclosure.

In particular, FIG. 9 shows exemplary implementation of the package 100 that may include any one or more other features, components, arrangements, and the like as described herein. In particular, FIG. 9 is a cross-section along line IX-IX of FIG. 7. In this regard, with a fan-out design of the package 100, the set of primary interconnects 201 and the set of secondary interconnects 203 in a center of the transformer 190 may have a shorter distance to travel, than the set of primary interconnects 201 and the set of secondary interconnects 203 at the edges of the fan, the second IPD implementation 300, the first IPD implementation 500, and/or the like.

In order to avoid having different inductance in the center than at the sides, the loop heights of the set of primary interconnects 201 and the set of secondary interconnects 203 of the transformer 190 array can be graded/profiled such that the set of primary interconnects 201 and the set of secondary interconnects 203 in the center of the fan, the second IPD implementation 300, the first IPD implementation 500, and/or the like are taller than the set of primary interconnects 201 and the set of secondary interconnects 203 at the edges of the fan, the second IPD implementation 300, the first IPD implementation 500, and/or the like. This way all the wires can have equal length and inductance.

Figure 10:
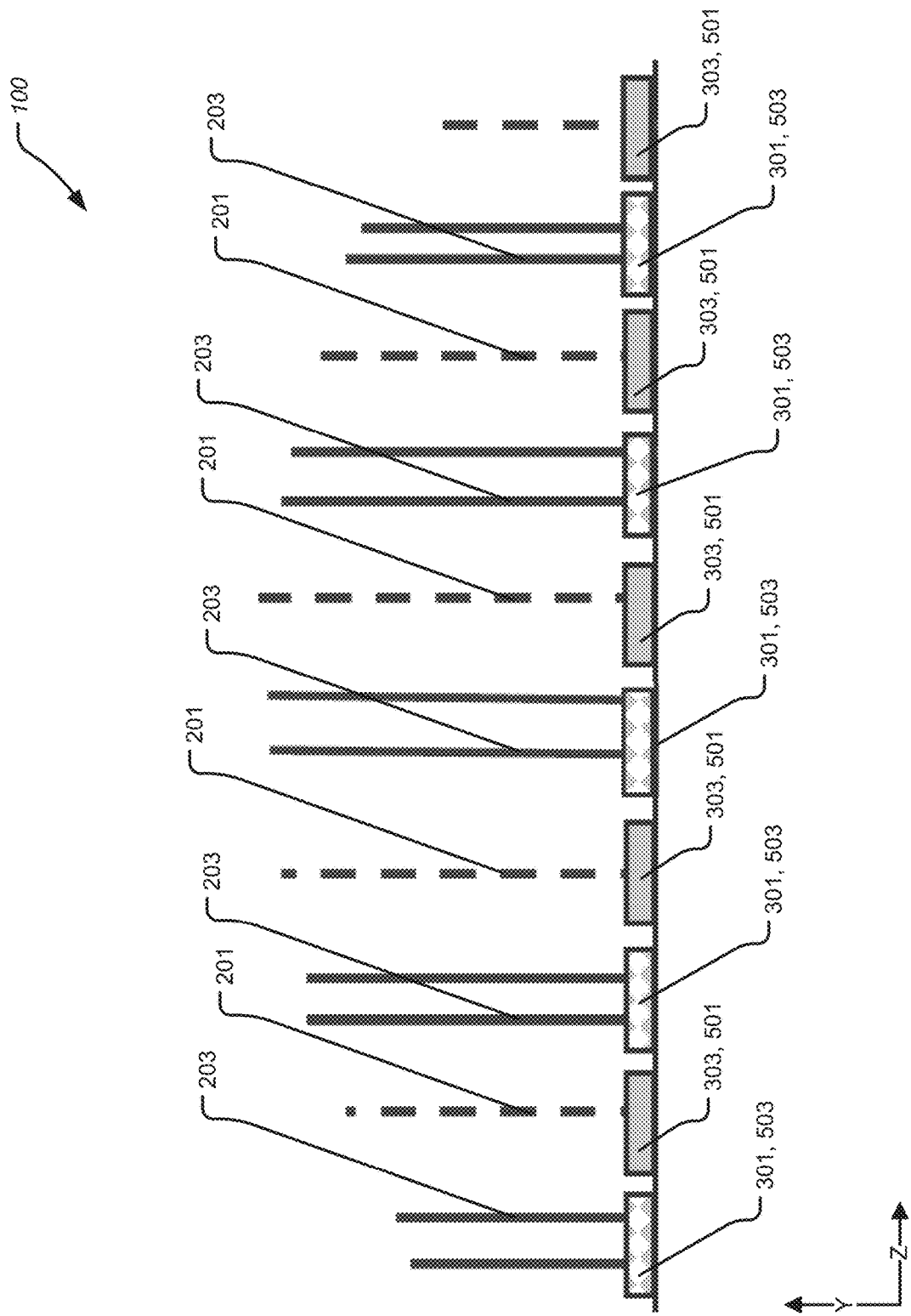
FIG. 10 illustrates an exemplary wire heights according to aspects of the disclosure.

FIG. 10 illustrates an exemplary wire heights according to aspects of the disclosure.

Figure 11:
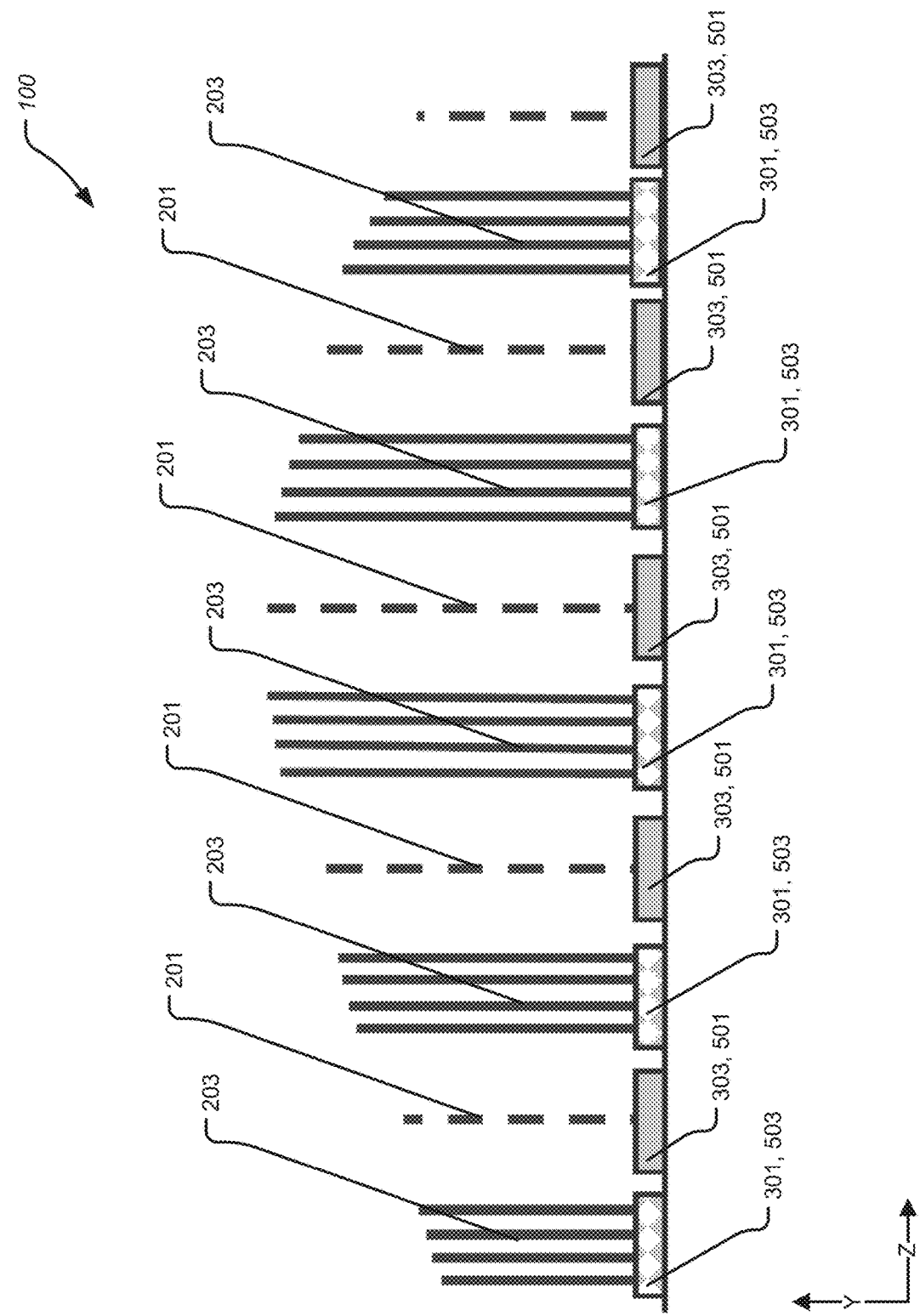
FIG. 11 illustrates an exemplary wire heights according to aspects of the disclosure.

FIG. 11 illustrates an exemplary wire heights according to aspects of the disclosure.

In particular, FIG. 10 and FIG. 11 illustrate exemplary implementations of the package 100 that may include any one or more other features, components, arrangements, and the like as described herein. Specifically, FIG. 10 and FIG. 11 illustrate a cross-sectional view where the set of secondary interconnects 203 and the set of primary interconnects 201 do not have a one to one ratio in the number wires. In order to have broad band impedance transformation, the ratio of a number of the set of secondary interconnects 203 and the set of primary interconnects 201 wires can be changed to aid in the impedance transformation. In this regard, FIG. 10 illustrates a 1:2 ratio for primary to secondary wire bonds; and FIG. 11 shows a 1:4 ratio for primary to secondary wire bonds. In this regard, in aspects the package 100 may have more secondary wires than primary wires. For example, the interconnects that connect to the final stage. More specifically, since an impedance of the final stage may be lower and/or a capacitance may be higher, the package 100 may have more secondary wires than primary wires. However, the disclosure further contemplates that the package 100 may include any ratio of the set of secondary interconnects 203 and the set of primary interconnects 201.

In other aspects, in order to have broad band impedance transformation, a size, a diameter, width, and/or the like of the set of secondary interconnects 203 and the set of primary interconnects 201 wires can be different to aid in the impedance transformation.

Figure 12:
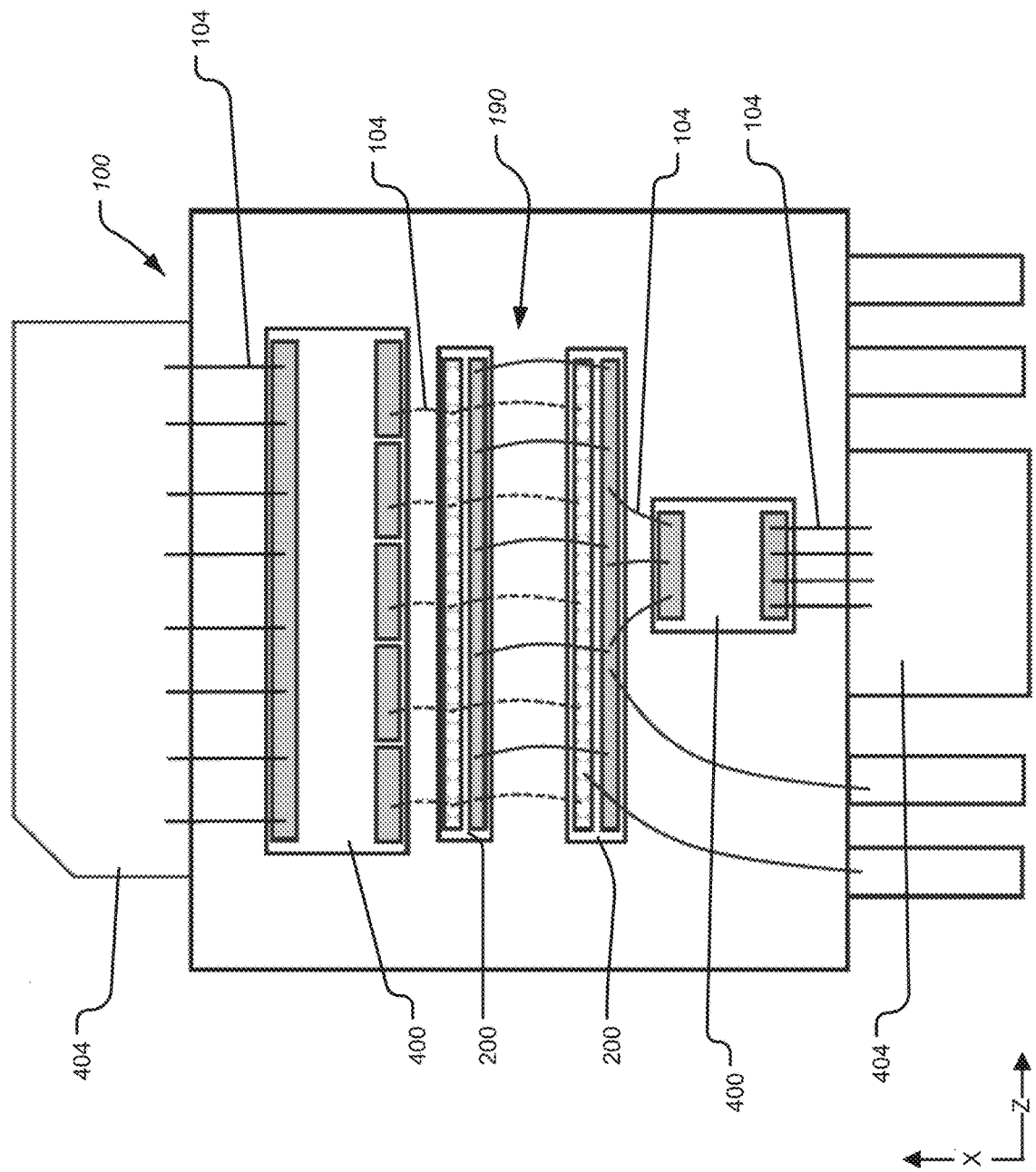
FIG. 12 illustrates a partial top view of the package according to a particular aspect of the disclosure.

FIG. 12 illustrates a partial top view of the package according to a particular aspect of the disclosure.

Figure 13:
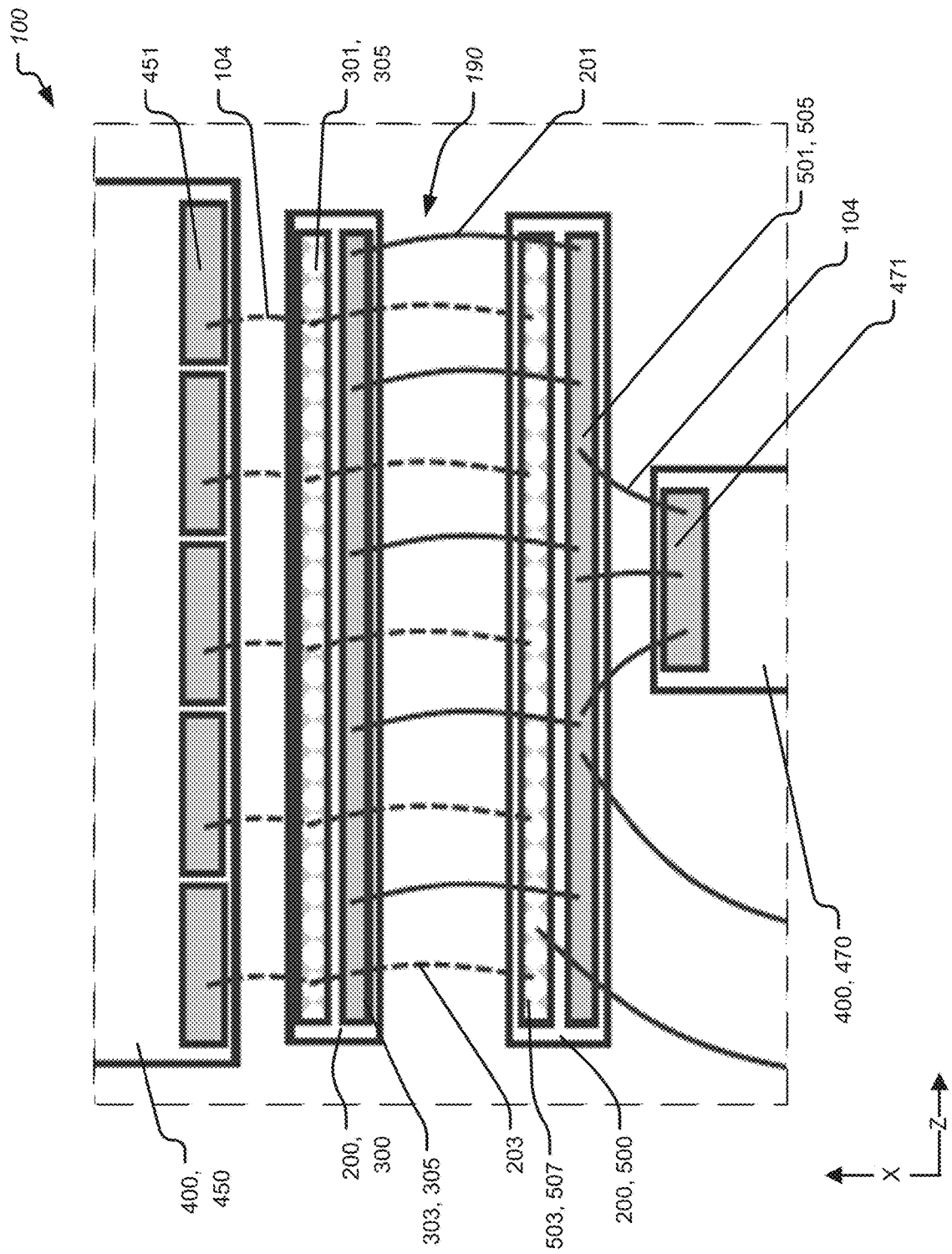
FIG. 13 illustrates a further partial top view of the package according to FIG. 13.

FIG. 13 illustrates a further partial top view of the package according to FIG. 13.

Figure 14:
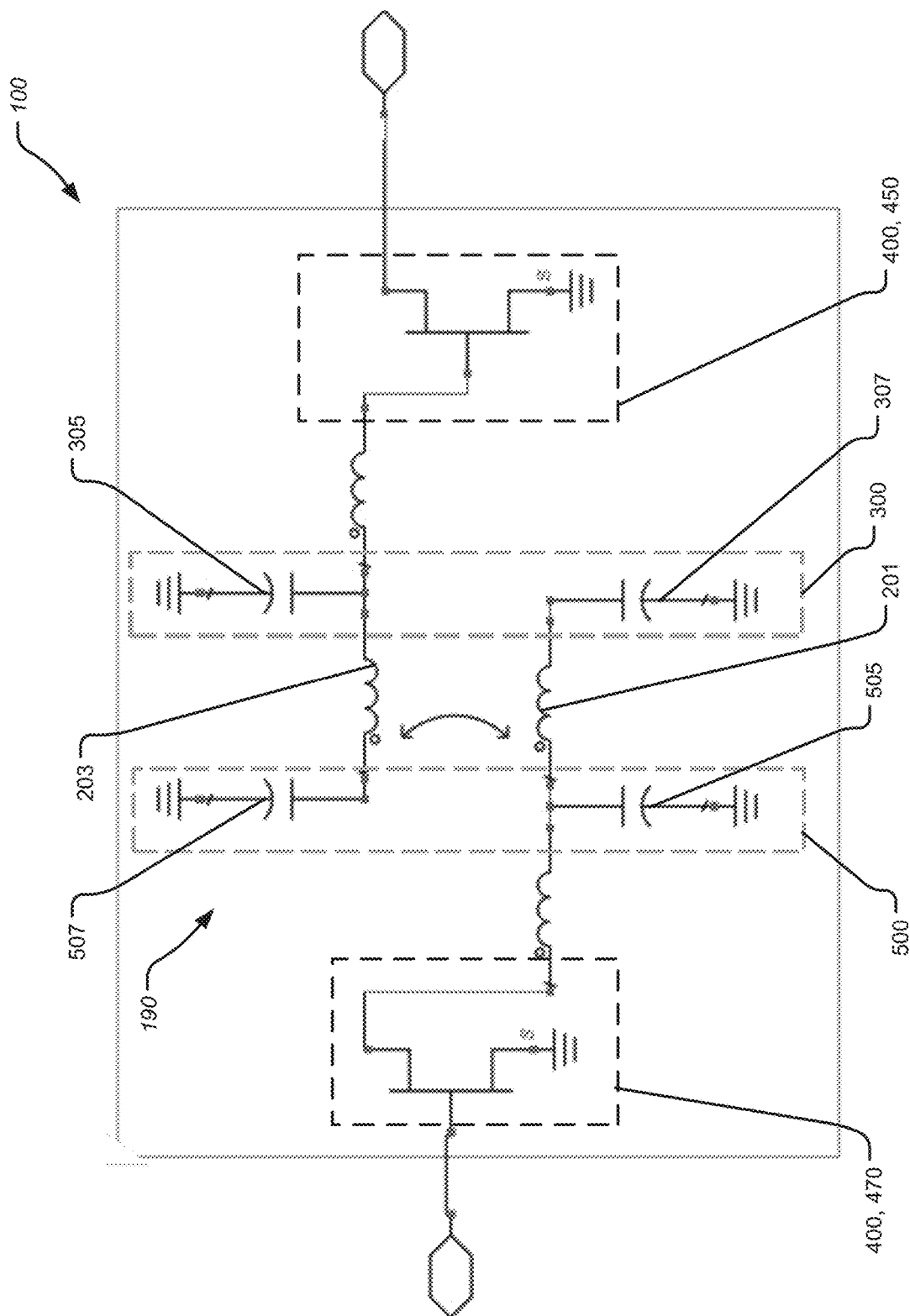
FIG. 14 illustrates an equivalent circuit schematic of the package according to FIG. 12.

FIG. 14 illustrates an equivalent circuit schematic of the package according to FIG. 12.

In particular, FIG. 12 shows exemplary implementation of the package 100 that may include any one or more other features, components, arrangements, and the like as described herein. More specifically, FIG. 12 illustrates an implementation of the package 100 implementing a different aspect of the IPD component 200.

As illustrated in FIG. 13 aspect, the second IPD implementation 300 and the first IPD implementation 500 may implement primary and secondary capacitors that may be integrated onto one chip. Accordingly, the second IPD implementation 300 and the first IPD implementation 500 illustrated in the FIG. 13 aspect may be implemented as a dual capacitor IPD. In aspects, the second IPD implementation 300 and the first IPD implementation 500 may not be interdigitated. In other words, the one or more interconnect pads 301 and the one or more interconnect pads 303 may extend along the length of the second IPD implementation 300; and the one or more interconnect pads 503 and the one or more interconnect pads 501 may extend along the length of the first IPD implementation 500.

More specifically, the second IPD implementation 300 may include a single implementation of the one or more interconnect pads 303 and a single implementation of the one or more interconnect pads 301. The one or more interconnect pads 301 may be connected to the capacitor 305 as illustrated in FIG. 14; and the one or more interconnect pads 303 may be connected to the capacitor 307 as illustrated in FIG. 14. Additionally, the first IPD implementation 500 may include a single implementation of the one or more interconnect pads 503 and a single implementation of the one or more interconnect pads 501. The one or more interconnect pads 501 may be connected to the capacitor 505 as illustrated in FIG. 14; and the one or more interconnect pads 503 may be connected to the capacitor 507 as illustrated in FIG. 14.

In other words, each capacitor of the second IPD implementation 300 and the first IPD implementation 500 may have a separate bond pad, thus each dual capacitor IPD implementation of the second IPD implementation 300 and the first IPD implementation 500 may have two continuous bond pads.

The IPD component 200 and the first IPD implementation 500 illustrated in the FIG. 12 aspect may have the same physical size. In some aspects, the set of primary interconnects 201 and the set of secondary interconnects 203 may not fan-out; and the set of primary interconnects 201 and the set of secondary interconnects 203 may have the same loop heights across the array of the transformer 190. This implementation may be easier to fabricate and manufacture in volume, with a slight trade-off in the mutual coupling coefficient of the transformer 190. Since the starting and landing feet of the set of primary interconnects 201 and the set of secondary interconnects 203 may not be aligned, the mutual coupling or coupling coefficient may be slightly reduced, but still enough for a decent interstage match. Aspects of FIG. 12 may also be better for feeding a uniform DC gate voltage to all tubs of the second device implementation 450, such as final transistor die. FIG. 14 illustrates an equivalent circuit schematic of the package 100 according to FIG. 12 and this equivalent circuit may be consistent with FIG. 8.

Figure 15:
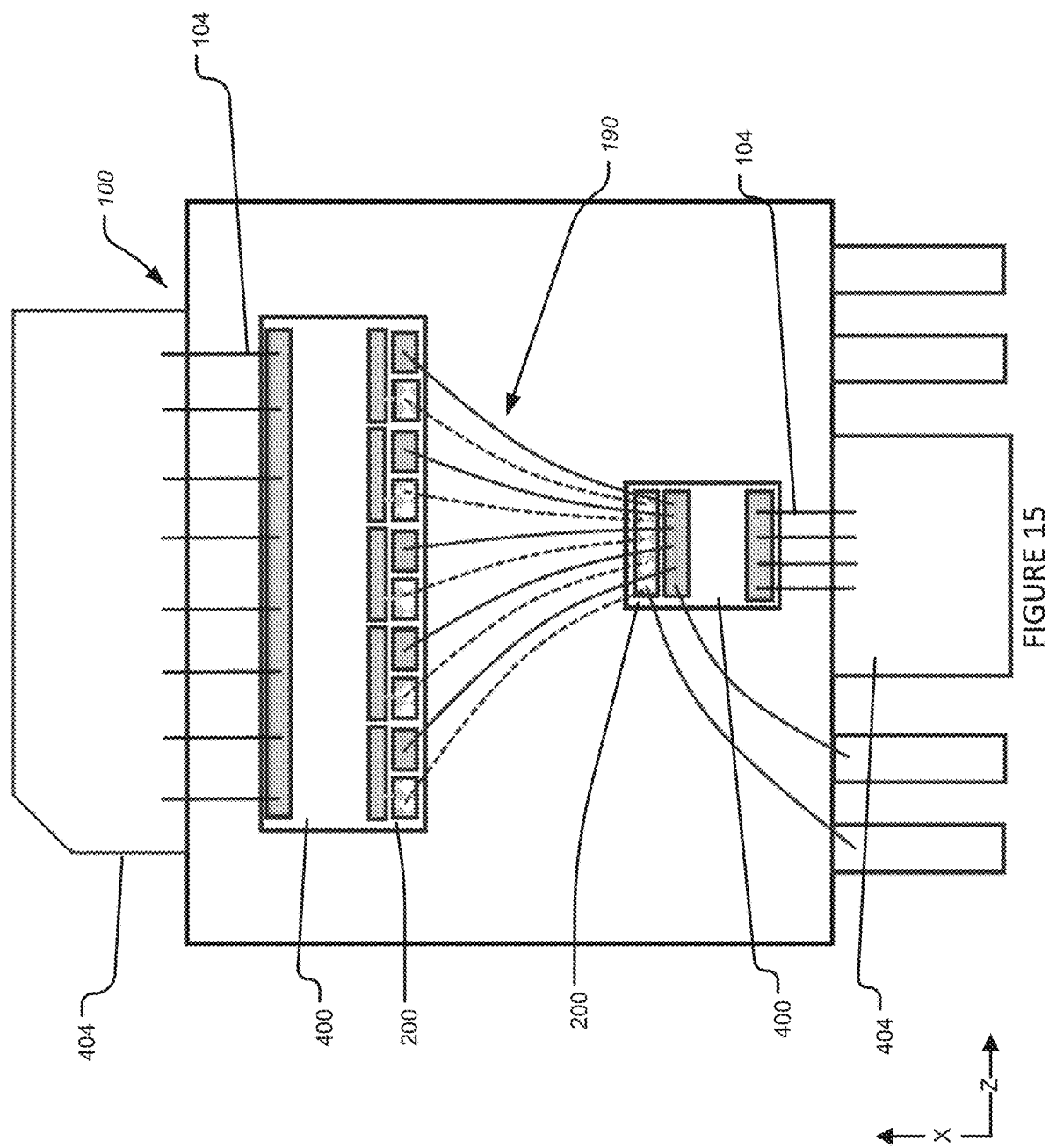
FIG. 15 illustrates a partial top view of the package according to a particular aspect of the disclosure.

FIG. 15 illustrates a partial top view of the package according to a particular aspect of the disclosure.

Figure 16:
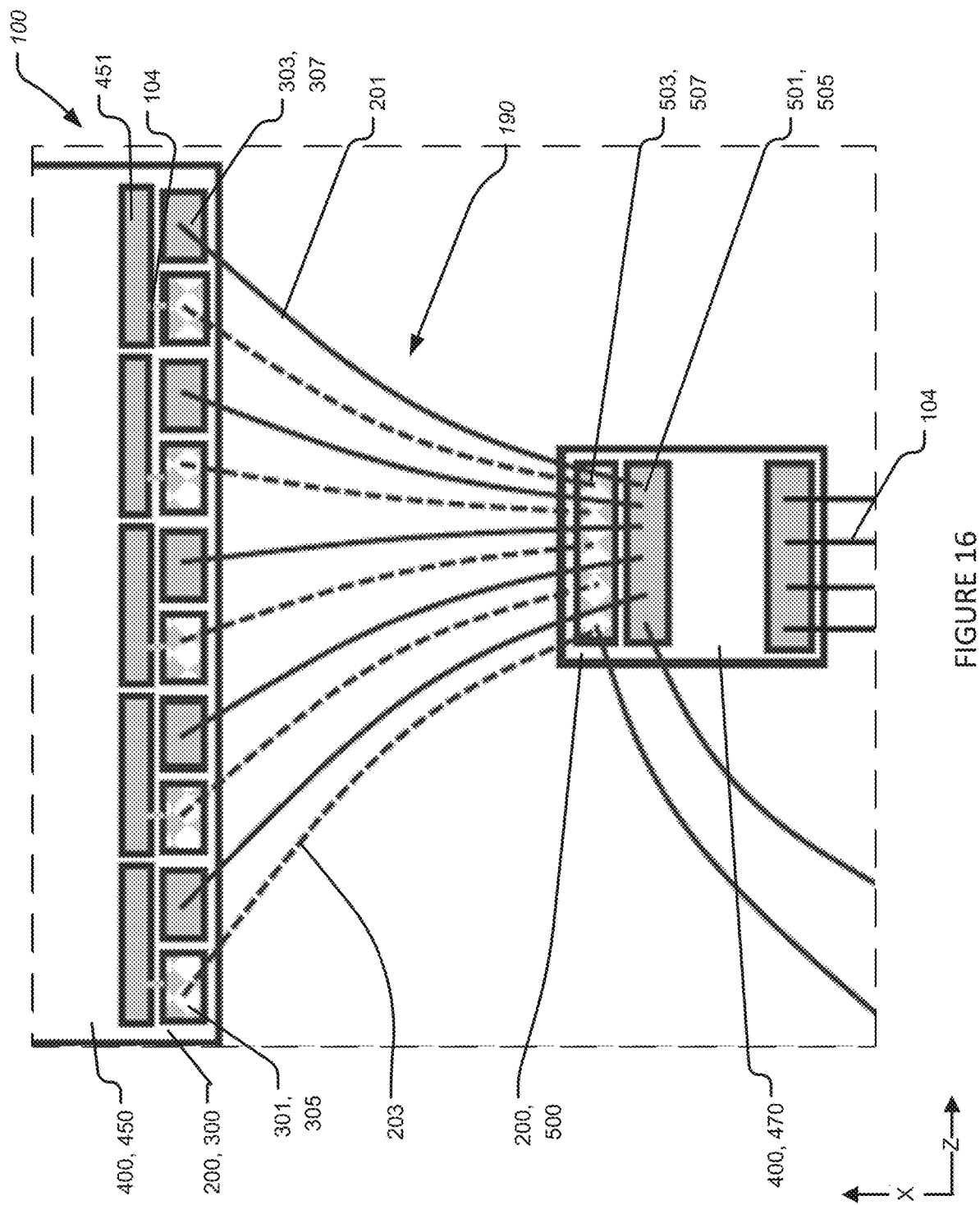
FIG. 16 illustrates a further partial top view of the package according to FIG. 15.

FIG. 16 illustrates a further partial top view of the package according to FIG. 15.

In particular, FIG. 15 shows exemplary implementation of the package 100 that may include any one or more other features, components, arrangements, and the like as described herein. More specifically, FIG. 15 illustrates an implementation of the package 100 implementing a different aspect of the IPD component 200.

More specifically, in the FIG. 15 implementation, a functionality or circuitry of the IPD component 200, such the capacitor arrays and some inductance, may be integrated into the same chips as the one or more semiconductor devices 400. In this regard, the functionality and the circuitry of the second IPD implementation 300 may be implemented into the second device implementation 450; and the functionality and the circuitry of the first IPD implementation 500 may be implemented into the first device implementation 470.

In one aspect, the first IPD implementation 500 may be integrated onto the output side of the first device implementation 470, such as a driver transistor die. For the driver die, the capacitors may be placed in a dual capacitor arrangement. Moreover, the capacitors may not be interdigitated because the first device implementation 470 may be smaller, and there may not be enough room for the one or more interconnect pads 503 to be configured in the interdigitated format. The set of primary interconnects 201 and the set of secondary interconnects 203 bonds of the transformer 190 may be bonded directly from the integrated implementation of the first device implementation 470, such as a driver die, to the integrated implementation of the first device implementation 470, such as a final die. Though the die size of the first device implementation 470 and the second device implementation 450 may increase slightly, there is no interstage IPDs needed in between the second device implementation 450 and the first device implementation 470.

Figure 17:
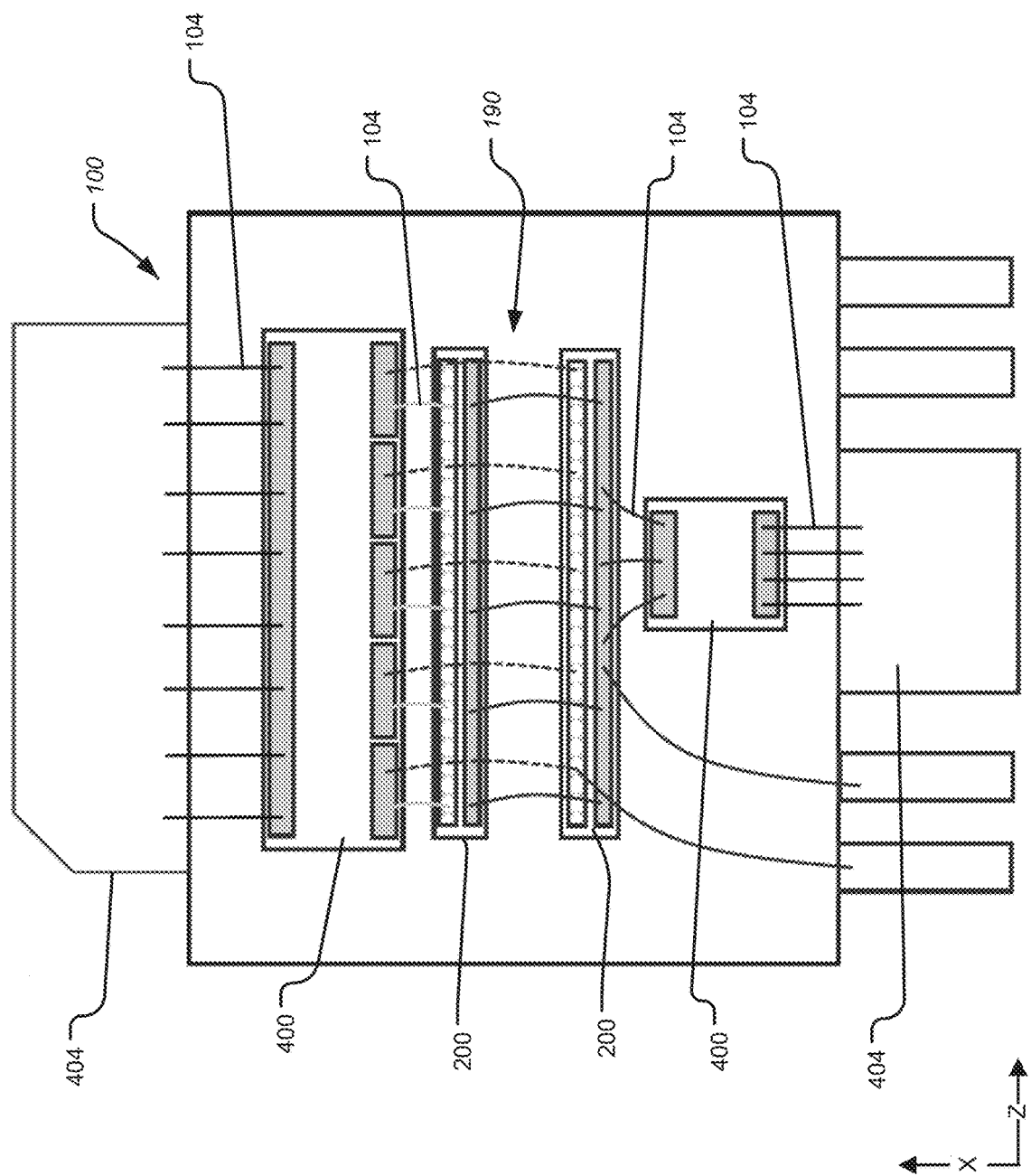
FIG. 17 illustrates a partial top view of the package according to a particular aspect of the disclosure.

FIG. 17 illustrates a partial top view of the package according to a particular aspect of the disclosure.

Figure 18:
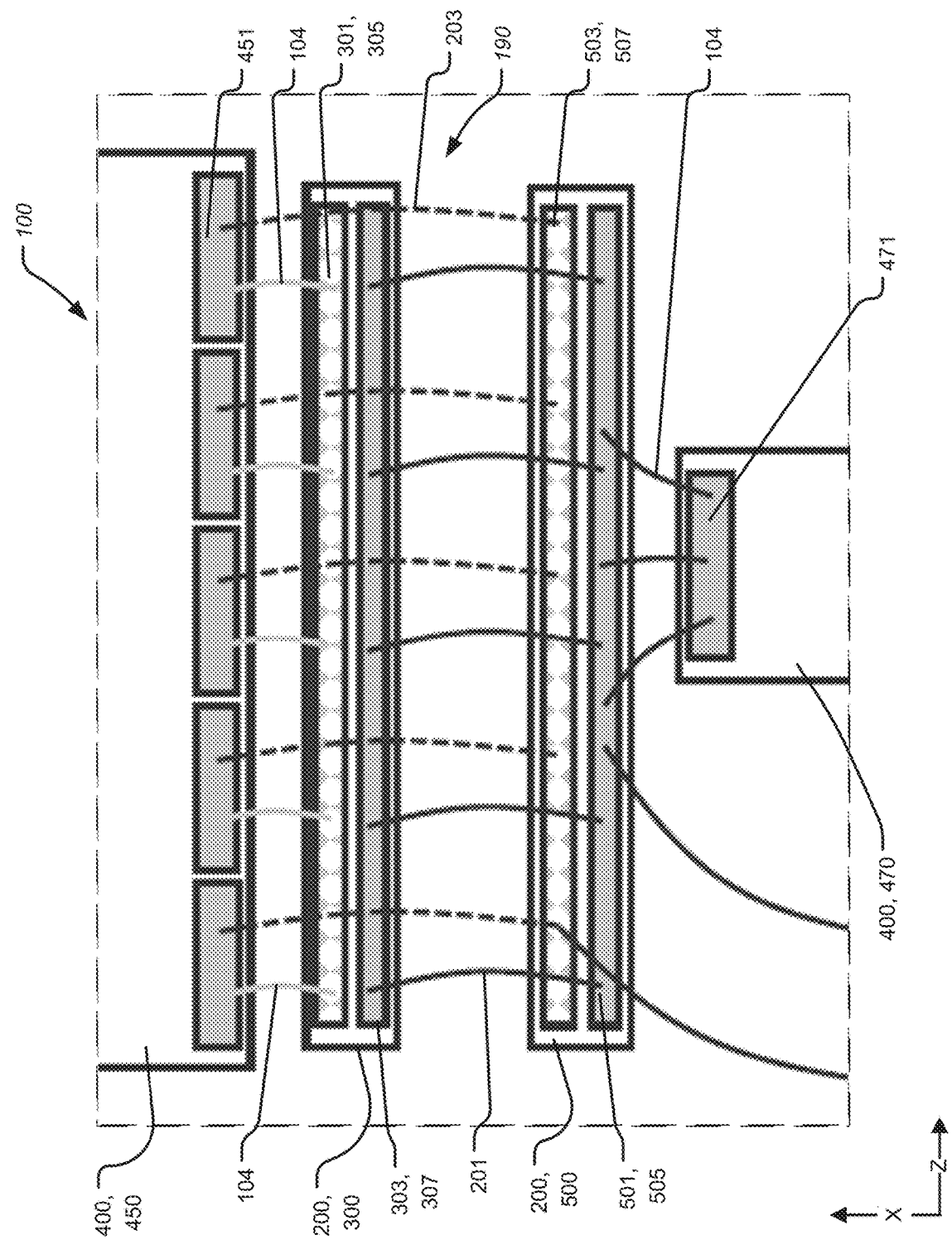
FIG. 18 illustrates a further partial top view of the package according to FIG. 17.

FIG. 18 illustrates a further partial top view of the package according to FIG. 17.

Figure 19:
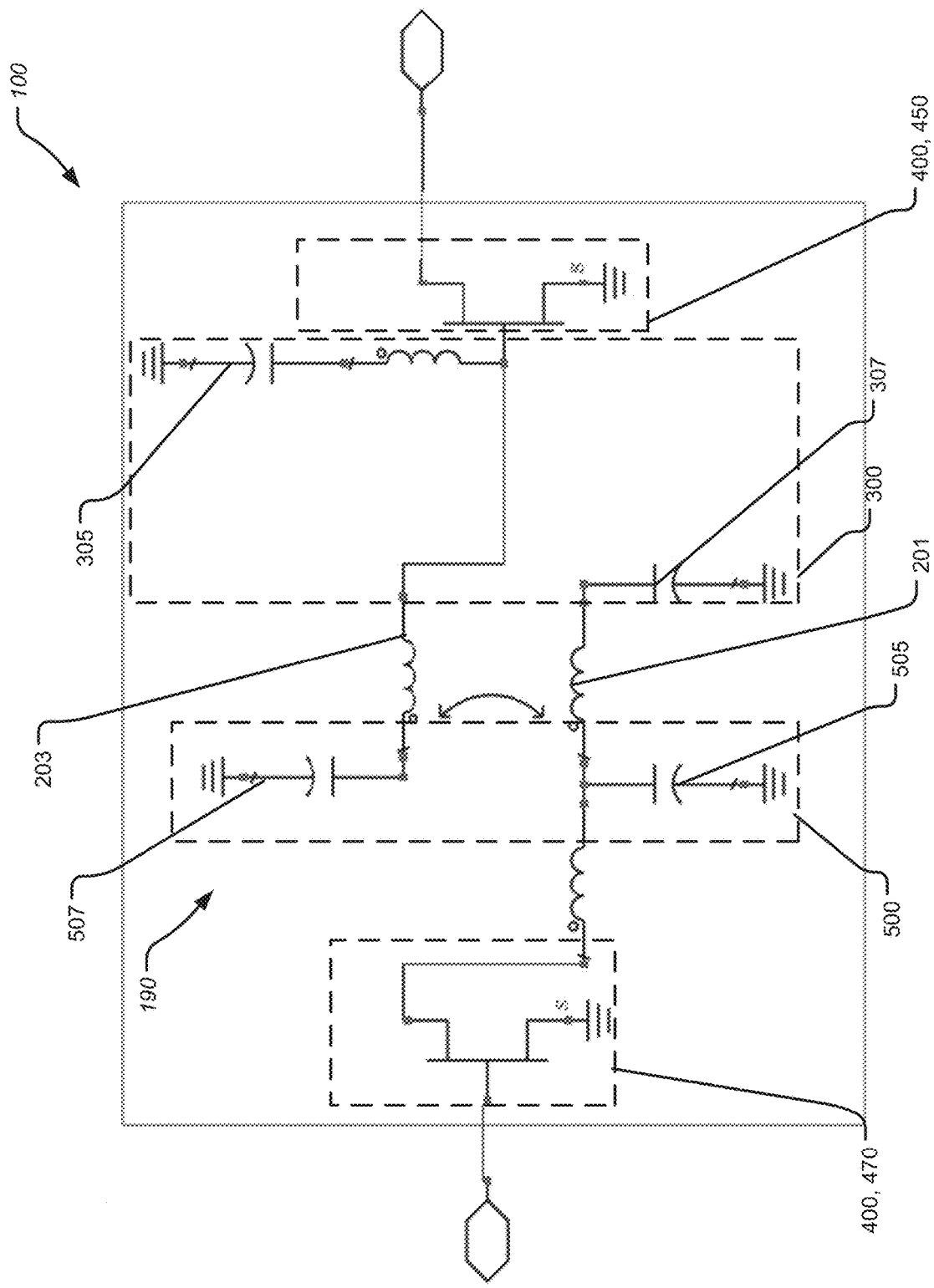
FIG. 19 illustrates an equivalent circuit schematic of the package according to FIG. 17.

FIG. 19 illustrates an equivalent circuit schematic of the package according to FIG. 17.

In particular, FIG. 17 shows exemplary implementation of the package 100 that may include any one or more other features, components, arrangements, and the like as described herein. FIG. 17 illustrates an aspect of the package 100 that may be implemented for higher frequency operation. In this regard, an input impedance of the first device implementation 470, such as final stage die, can be very low and challenging to match. Accordingly, a shunt L-C network on the input of the first device implementation 470 may greatly improve the ability to implement a broadband match.

As illustrated in FIG. 18 a first set of wire bonds on the input of the final die may create a shunt L match. In particular, the one or more interconnects 104 may connect to the one or more interconnect pads 301 of the second IPD implementation 300 and the one or more interconnect pads 451 of the second device implementation 450. The secondary capacitor on the second IPD implementation 300 may be used for this shunt LC match.

Additionally, the set of secondary interconnects 203 may connect directly to the one or more interconnect pads 451 of the second device implementation 450, which may be the input gate pads of the second device implementation 450 that may be implemented as a final die. Otherwise, implementation of the package 100 may be consistent as illustrated in FIG. 17.

Figure 20:
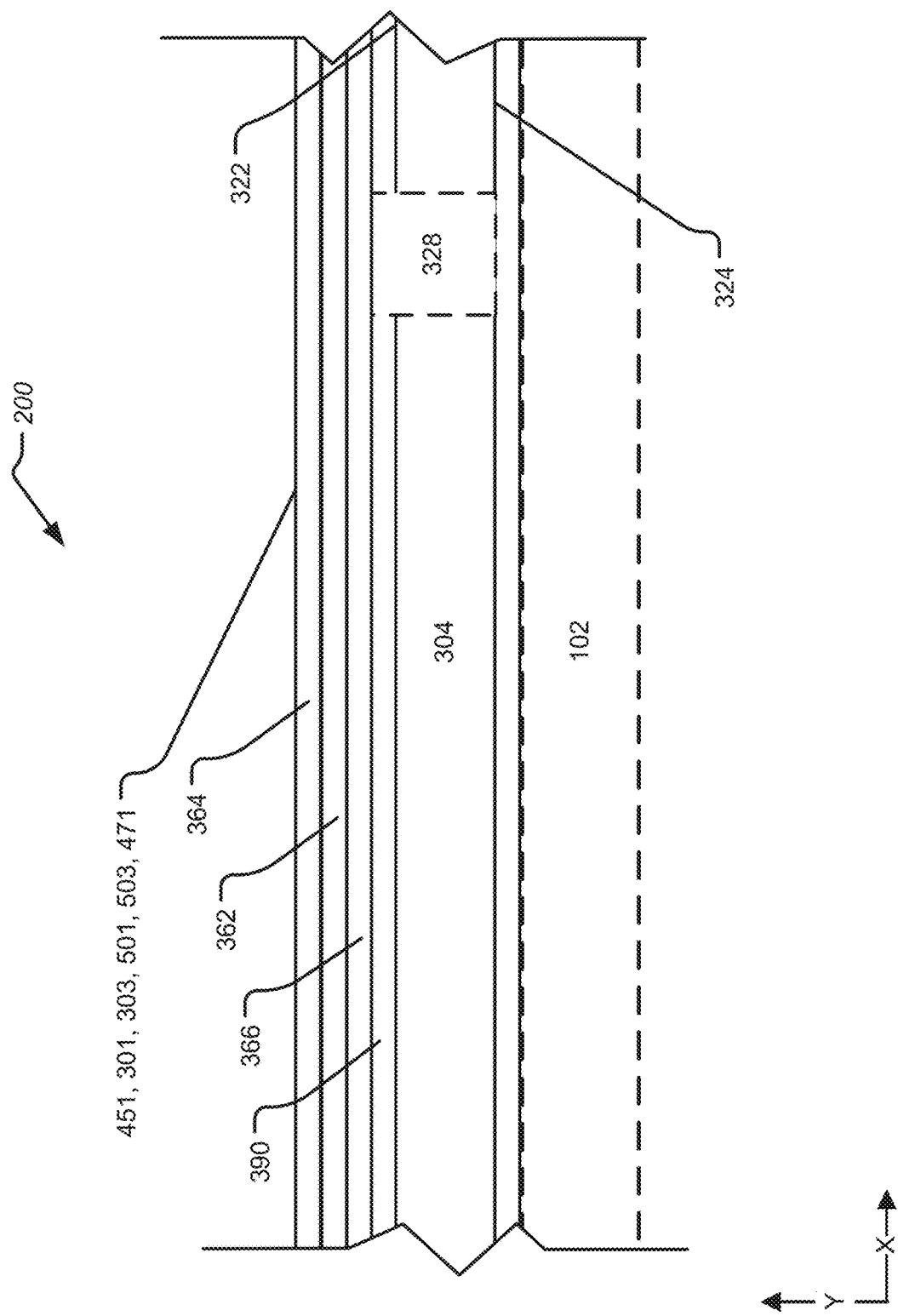
FIG. 20 illustrates a partial side view of an IPD component according to the disclosure.

FIG. 20 illustrates a partial side view of an IPD component according to the disclosure.

In particular, FIG. 20 illustrates exemplary implementations of the IPD component 200 that may include any one or more other features, components, arrangements, and the like as described herein. The IPD component 200 may include a substrate 304, a dielectric layer 362, a top metal 364, a bottom metal 366, a backside metal, and/or the like. Additionally, the IPD component 200 may include an electrical connection such as vias 328. However, any type of electrical connection is contemplated. In some aspects, the IPD component 200 may include an intervening layer 390. In some aspects, the IPD component 200 may be implemented without the intervening layer 390.

The IPD component 200 may be configured as the first IPD implementation 500. In aspects, the IPD component 200 configured as the second IPD implementation 300.

In particular aspects, there may be one or more intervening layers between the substrate 304, the dielectric layer 362, the top metal 364, the bottom metal 366, and/or the backside metal. As further described herein, the top metal 364, the bottom metal 366, and/or other metal layers of the IPD component 200 may form one or more of a capacitor, a resistor, an inductor, a trace, and/or the like. In particular aspects, the top metal 364, the bottom metal 366, and/or other metal layers of the IPD component 200 may form the capacitor 505, the capacitor 507, the capacitor 305, and the capacitor 307

The substrate 304 may include SiC and/or may be made of SiC. In some aspects, the substrate 304 may be a semi-insulating SiC substrate, a p-type substrate, an n-type substrate, and/or the like. In some aspects, the substrate 304 may be very lightly doped. In one aspect, the substrate 304 may be formed of SiC selected from the group of 6H, 4H, 15R, 3C SiC, or the like. In one aspect, the substrate 304 may be formed of SiC that may be semi-insulating and doped with vanadium or any other suitable dopant or undoped of high purity with defects providing the semi-insulating properties. In other aspects, the substrate 304 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. The substrate 304 may include an upper surface 322. The upper surface 322 may support the bottom metal 366 and/or the intervening layer 390.

In particular aspects, the substrate 304 of may include the vias 328 extending along the y-axis through the substrate 304. One or more of the vias 328 may be electrically connected to the backside metal. Additionally, one or more of the vias 328 may be electrically connected to the bottom metal 366 and/or the top metal 364.

The bottom metal 366 may be arranged on the upper surface 322 of the substrate 304 and/or the intervening layer 390. In particular, there may be one or more intervening layers or structures between the upper surface 322 of the substrate 304 and the bottom metal 366 (not shown). The bottom metal 366 may be formed as a metal surface on the upper surface 322 of the substrate 304 and/or the intervening layer 390 and may comprise a metallic material such as copper, gold, nickel, palladium, silver, tin, a gold tin alloy, and the like, and combinations thereof. In one aspect, the bottom metal 366 may have a thickness along the y-axis of 1 micron to 9 microns, 1 micron to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The dielectric layer 362 may be arranged on the bottom metal 366 and/or the substrate 304. In particular, there may be one or more intervening layers or structures between the dielectric layer 362 and the bottom metal 366 (not shown). In other aspects, the dielectric layer 362 may be directly arranged on the bottom metal 366. In one aspect, the dielectric layer 362 may be continuous and/or may be discontinuous. The dielectric layer 362 may include SiN, AlO, SiO, $SiO_2$, AlN, or the like or combinations thereof together with other intervening layers. The dielectric layer 362 may have any thickness along a y-axis to provide the desired capacitance density, capacitance, standoff voltage, and/or the like. In some aspects, the dielectric layer 362 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The top metal 364 may be arranged on the dielectric layer 362. In particular, there may be one or more intervening layers or structures between the top metal 364 and the dielectric layer 362 (not shown). In other aspects, the top metal 364 may be directly arranged on the dielectric layer 362. The top metal 364 may be formed as a metal surface on an upper surface the dielectric layer 362 and may comprise a metallic material such as copper, gold, nickel, palladium, silver, tin, a gold tin alloy, and the like, and combinations thereof. In some aspects, the top metal 364 may comprise stacked layers. In one aspect, the top metal 364 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The substrate 304 may include a lower surface 324. The backside metal may be located on the lower surface 324 of the substrate 304 opposite the upper surface 322. The backside metal may be located in a plane generally parallel to the x-axis or a plane generally parallel to the upper surface 322. The backside metal may comprise a metallic material such as copper, gold, nickel, palladium, silver, tin, a gold tin alloy, and the like, and combinations thereof. In one aspect, the backside metal may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The vias 328 may be metallic plated holes or metallic filled holes that may function as electrical tunnels through the substrate 304. The vias 328 may comprise a metallic material such as copper, gold, nickel, palladium, silver, tin, a gold tin alloy, and the like, and combinations thereof. The vias 328 may have an axis that may be located in a plane generally perpendicular to the x-axis, a plane generally parallel to the x-axis, and/or a plane generally perpendicular to the upper surface 322.

An upper surface 322 of the top metal 364 may form and/or may support the one or more interconnect pads 301, the one or more interconnect pads 303, the one or more interconnect pads 501, the one or more interconnect pads 503, and/or the like. The one or more interconnect pads 301, the one or more interconnect pads 303, the one or more interconnect pads 501, the one or more interconnect pads 503, and/or the like may include multiple bond pad areas. In other aspects, the one or more interconnect pads 301, the one or more interconnect pads 303, the one or more interconnect pads 501, the one or more interconnect pads 503, and/or the like may be formed by a single bar structure that may be continuous. The one or more interconnect pads 301, the one or more interconnect pads 303, the one or more interconnect pads 501, the one or more interconnect pads 503, and/or the like may be formed by a metal surface on the dielectric layer 362 and/or the top metal 364 and may comprise a metallic material such as copper, gold, nickel, palladium, silver, and the like, and combinations thereof.

In one aspect, the intervening layer 390 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. In one aspect, the intervening layer 390 is formed of GaN. In one aspect, the intervening layer 390 is directly on the substrate 304. In some aspects, the intervening layer 390 may be formed directly on a nucleation layer or on the nucleation layer with intervening layer(s). In one aspect, the intervening layer 390 may be high purity GaN. In one aspect, the intervening layer 390 may be high purity GaN that may be a low-doped n-type.

In particular, as illustrated in FIG. 6 portions of the IPD component 200 may form the capacitor 307, the capacitor 305, the capacitor 507, and/or the capacitor 505 with the top metal 364 and the bottom metal 366 having the dielectric layer 362 therebetween. The bottom metal 366 may be connected to the vias 328. The top metal 364 may be arranged parallel to the x-axis as illustrated, the top metal 364 may be discontinuous and arranged parallel the bottom metal 366. Moreover, the top metal 364 may be arranged at least partially vertically above the bottom metal 366 along the y-axis as illustrated. The top metal 364 may be formed as a metal surface and may comprise a metallic material such as copper, gold, nickel, palladium, silver, tin, a gold tin alloy, and the like, and combinations thereof. In one aspect, the bottom metal 366 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The capacitance of the capacitor 307, the capacitor 305, the capacitor 507, and/or the capacitor 505 may then be defined by the area of the bottom metal 366, the top metal 364, and the thickness and dielectric constant of the dielectric layer 362, and may have an independent and isolated region on a backside of the substrate 304 for electrical connection by the backside metal. The dielectric layer 362 may have any thickness along a y-axis to provide the desired capacitance density, capacitance, standoff voltage, and/or the like.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The IPD component 200 may be an active device, a passive device, an IPD, a transistor device, or the like. The IPD component 200 may include any electrical component for any application. In this regard, the IPD component 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The IPD component 200 may be implemented as a radio frequency device may be configured to, may support, or the like transmitting a radio wave and modulating that wave to carry data with allowable transmitter power output, harmonics, and/or band edge requirements. The IPD component 200 implemented as a radio frequency device may be configured to, may support, or the like receiving a radio wave and demodulating the radio wave. The IPD component 200 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

Figure 21:
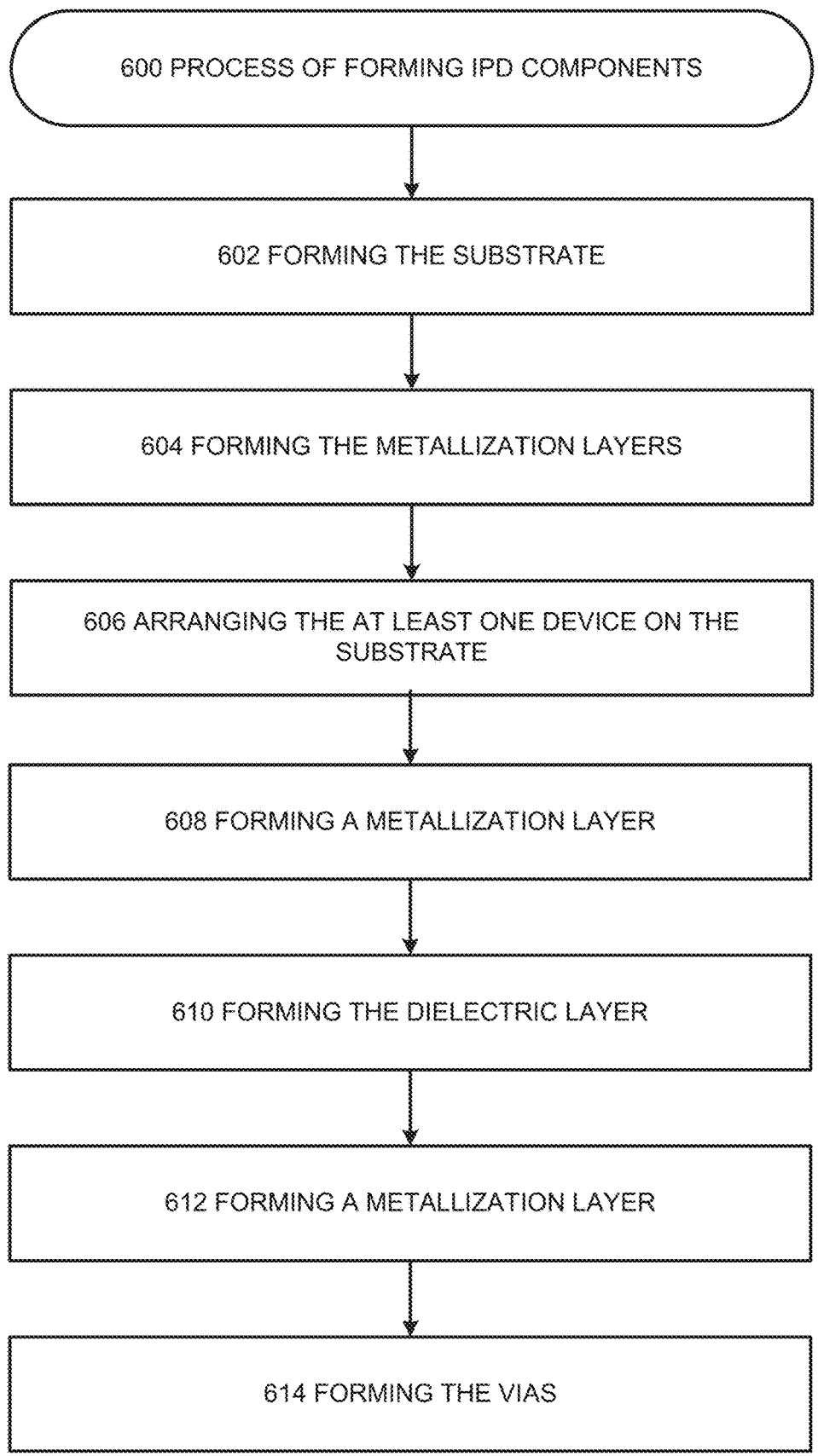
FIG. 21 shows a process of making IPD components according to the disclosure.

FIG. 21 shows a process of making IPD components according to the disclosure.

In particular, FIG. 21 illustrates a process of forming IPD components 600 that relates to the IPD component 200 as described herein. It should be noted that the aspects of the process of forming IPD components 600 may be performed in a different order consistent with the aspects described herein. Additionally, it should be noted that portions of the process of forming IPD components 600 may be performed in a different order consistent with the aspects described herein. Moreover, the process of forming IPD components 600 may be modified to have more or fewer processes consistent with the various aspects disclosed herein. Additionally, the process of forming IPD components 600 may include any other aspects of the disclosure described herein.

Initially, the process of forming IPD components 600 may include a process of forming the substrate 602. More specifically, the substrate 304 may be constructed, configured, and/or arranged as described herein.

Further, the process of forming IPD components 600 may include forming a metallization layer 604. More specifically, the backside metal may be constructed, configured, and/or arranged as described herein on at least a portion of the substrate 304. The process of forming the metallization layer 604 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the intervening layer 390 on the substrate 606. The intervening layer 390 may be grown or deposited on the substrate 304. In one aspect, the intervening layer 390 may be GaN. In another aspect, the intervening layer 390 may be formed with LEO. In one aspect, a nucleation layer may be formed on the substrate 304 and the intervening layer 390 may be formed on the nucleation layer. The intervening layer 390 may be grown or deposited on the nucleation layer.

Further, the process of forming IPD components 600 may include forming a metallization layer 608. More specifically, the bottom metal 366 may be constructed, configured, and/or arranged as described herein on at least a portion of the substrate 304. The process of forming the metallization layer 608 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the dielectric layer 610. More specifically, the dielectric layer 362 may be constructed, configured, and/or arranged as described herein on at least a portion of the substrate 304, the intervening layer 390, the bottom metal 366, and/or the like. The process of forming the dielectric layer 362 may can be deposited using MOCVD, plasma chemical vapor deposition (CVD), hot-filament CVD, or sputtering. In one aspect, the dielectric layer 362 may include deposition. In one aspect, the dielectric layer 362 forms an insulating layer. In one aspect, the dielectric layer 362 forms an insulator.

Further, the process of forming IPD components 600 may include forming a metallization layer 612. More specifically, the top metal 364 may be constructed, configured, and/or arranged as described herein on at least a portion of the dielectric layer 362 and/or the like. The process of forming the metallization layer 612 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming a metallization layer 612 may include forming the interconnect pad. More specifically, the one or more interconnect pads 301, the one or more interconnect pads 303, the one or more interconnect pads 501, the one or more interconnect pads 503, and/or the like may be constructed, configured, and/or arranged as described herein on the substrate 304. Additionally, the one or more interconnect pads 301, the one or more interconnect pads 303, the one or more interconnect pads 501, the one or more interconnect pads 503, and/or the like may be constructed, configured, and/or arranged as described herein on the substrate 304. The process of forming the interconnect pad may include utilizing one or more manufacturing techniques including deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the vias 614. More specifically, the vias 328 may be constructed, configured, and/or arranged as described herein on at least a portion of the substrate 304.

Additionally, the process of forming IPD components 600 may include manufacturing to form the IPD component 200 in a panel, a wafer, and/or the like. The process of forming IPD components 600 may include backside etching and cutting the panel and/or the wafer utilizing cutting equipment such as wafer, circuit board, or package sawing equipment to singulate the IPD component 200 from the panel or the wafer, which may have the advantage that the IPD component 200, and/or may be arranged on dicing tape on a ring frame, which can be directly loaded to the Die Attach equipment for subsequent assembly into package 100.

Figure 22:
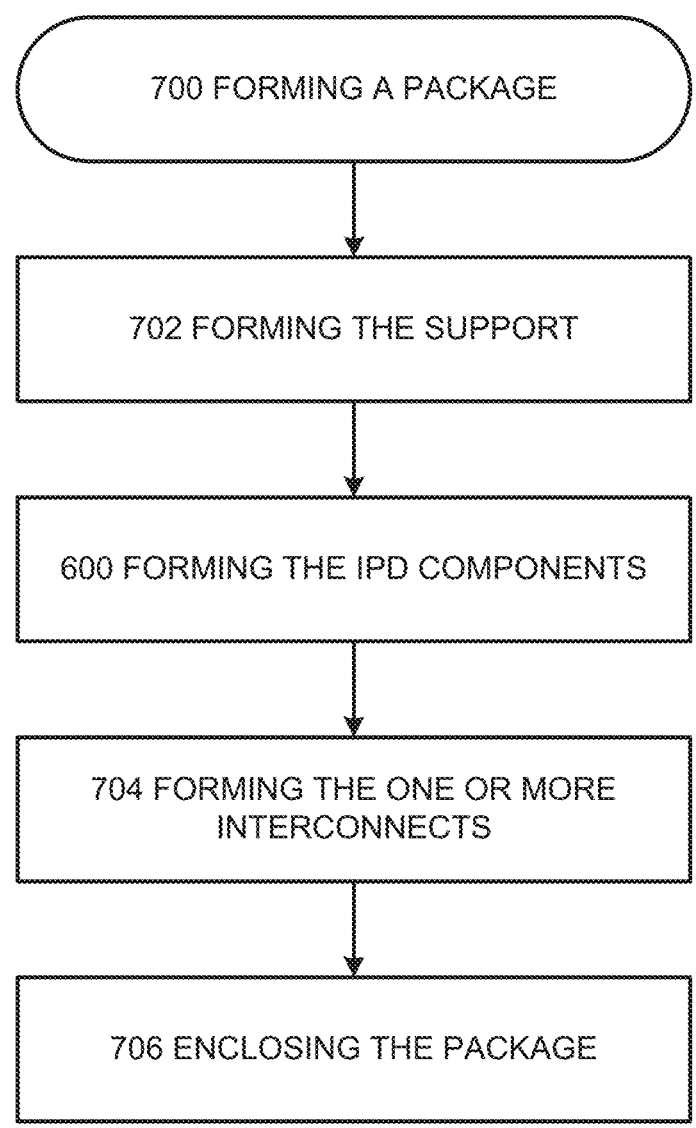
FIG. 22 shows a process of making a package according to the disclosure.
Figure 23:
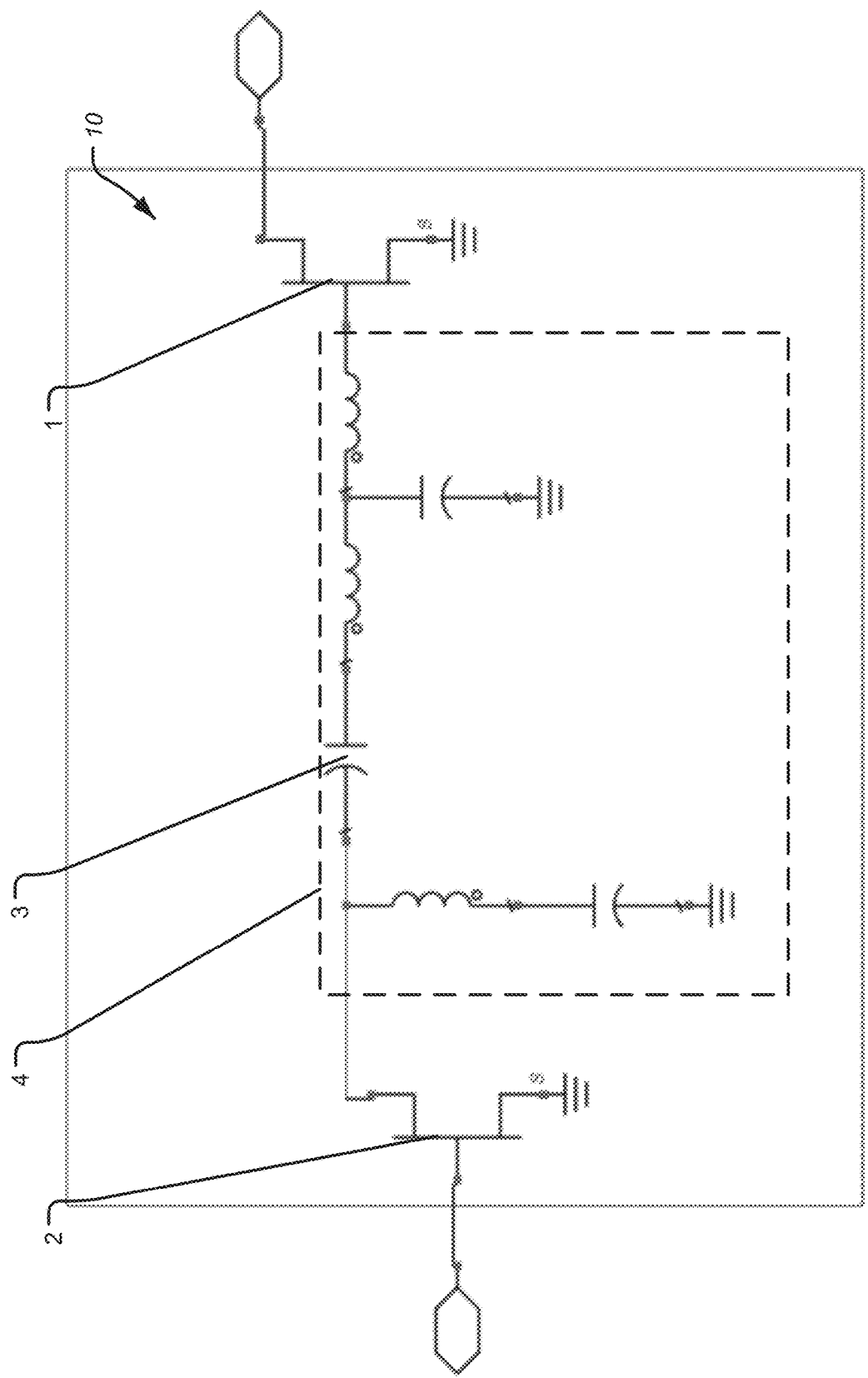
FIG. 23 illustrates an equivalent circuit for a prior art two stage amplifier with interstage match.

FIG. 22 shows a process of making a package according to the disclosure.

In particular, FIG. 22 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming IPD components 600. More specifically, the IPD component 200 may be constructed, configured, and/or arranged as described herein with reference to FIG. 21 and the associated description thereof. Thereafter, the process of forming IPD components 600 may further include attaching the IPD component 200 to the support 102. In this regard, the IPD component 200 may be mounted on the upper surface of the support 102 and/or the IPD component 200 by an adhesive, soldering, sintering, eutectic bonding, ultrasonically welding, and/or the like as described herein.

The process of forming a package 700 may include a process of forming the one or more interconnects 704. More specifically, the one or more interconnects 104, the set of primary interconnects 201, and/or the set of secondary interconnects 203 may be constructed, configured, and/or arranged as described herein. In one aspect, the process of forming the one or more interconnects 704 may include forming the one or more interconnects 104, the set of primary interconnects 201, and/or the set of secondary interconnects 203 by forming one or more wires, leads, vias, edge platings, circuit traces, tracks, and/or the like. In one aspect, the process of forming the one or more interconnects 704 may include connecting the one or more interconnects 704 by an adhesive, soldering, sintering, eutectic bonding, ultrasonic welding, a clip component, and/or the like as described herein.

The process of forming a package 700 may include a process of enclosing the package 706. More specifically, the package 100 may be constructed, configured, and/or arranged as described herein. In one aspect, the process of enclosing the package 706 may include forming an open cavity configuration, an over-mold configuration, or the like.

One aspect includes a device that includes a support 102; a first device implementation 470 arranged on said support 102; a second device implementation 450 arranged on said support 102; a set of primary interconnects 201; and a set of secondary interconnects 203, where the set of primary interconnects 201 and the set of secondary interconnects 203 are configured to provide RF signal coupling between the first device implementation 470 and the second device implementation 450 without a physical connection.

One aspect includes a device that includes a support 102; a first device implementation 470 arranged on said support 102; a second device implementation 450 arranged on said support 102; a set of primary interconnects 201; and a set of secondary interconnects 203, where the set of primary interconnects 201 and the set of secondary interconnects 203 are configured to provide RF signal coupling between the first device implementation 470 and the second device implementation 450 by electromagnetic coupling.

Aspects may include one or more of the following features: The device where the set of primary interconnects 201 and the set of secondary interconnects 203 are configured to provide an interstage match. The device where the set of primary interconnects 201 and the set of secondary interconnects 203 includes wires. The device where the set of primary interconnects 201 and the set of secondary interconnects 203 includes bond wires; and where the set of primary interconnects 201 and the set of secondary interconnects 203 implemented to provide a desired impedance based on a respective number of the bond wires, a respective size of the bond wires, a respective width of the bond wires, and/or a respective diameter of the bond wires. The device where the set of primary interconnects 201 and the set of secondary interconnects 203 are configured as a DC block between the first device implementation 470 and the second device implementation 450. The device where the set of primary interconnects 201 and the set of secondary interconnects 203 attenuate and/or filter lower frequency signals transferred between the first device implementation 470 and the second device implementation 450. The device where the first device implementation 470 is implemented as a driver stage transistor; and where the second device implementation 450 is implemented as a final stage transistor. The device where the set of primary interconnects 201 and the set of secondary interconnects 203 are configured as a transformer to provide RF signal coupling between the first device implementation 470 and the second device implementation 450. The device where the set of primary interconnects 201 and the set of secondary interconnects 203 are configured to fanout between the first device implementation 470 and the second device implementation 450. The device includes: a first IPD implementation 500 and a second IPD implementation 300, where the first device implementation 470 connects to the first IPD implementation 500 with one or more interconnects; and where the second device implementation 450 connects to the second IPD implementation 300 with one or more interconnects. The device where the first IPD implementation 500 connects to the second IPD implementation 300 with the set of secondary interconnects 203; and where the first IPD implementation 500 connects to the second IPD implementation 300 with the set of primary interconnects 201. The device where the first IPD implementation 500 includes an inter-digitated array of one or more interconnect pads; and where the second IPD implementation 300 includes an inter-digitated array of one or more interconnect pads. The device where the first IPD implementation 500 includes an inter-digitated array of capacitors; and where the second IPD implementation 300 includes an inter-digitated array capacitors. The device where the first IPD implementation 500 includes at least one capacitor; and where the second IPD implementation 300 includes at least one capacitor. The device where the first IPD implementation 500, the second IPD implementation 300, the set of primary interconnects 201, and the set of secondary interconnects 203 are configured to provide the RF signal from the first device implementation 470 to the second device implementation 450.

One aspect includes a process for implementing a device that includes providing a support 102; arranging a first device implementation 470 on said support 102; arranging a second device implementation 450 on said support 102; providing a set of primary interconnects 201; and providing a set of secondary interconnects 203, where the set of primary interconnects 201 and the set of secondary interconnects 203 are configured to provide RF signal coupling between the first device implementation 470 and the second device implementation 450 without a physical connection.

One aspect includes a process for implementing a device that includes providing a support 102; arranging a first device implementation 470 on said support 102; arranging a second device implementation 450 on said support 102; providing a set of primary interconnects 201; and providing a set of secondary interconnects 203, where the set of primary interconnects 201 and the set of secondary interconnects 203 are configured to provide RF signal coupling between the first device implementation 470 and the second device implementation 450 by electromagnetic coupling.

Aspects may include one or more of the following features: The process for implementing a device includes configuring the set of primary interconnects 201 and the set of secondary interconnects 203 to provide an interstage match. The process for implementing a device where the set of primary interconnects 201 and the set of secondary interconnects 203 includes wires. The process for implementing a device where the set of primary interconnects 201 and the set of secondary interconnects 203 includes bond wires; and the process includes: implementing the set of primary interconnects 201 and the set of secondary interconnects 203 to provide a desired impedance based on a respective number of the bond wires, a respective size of the bond wires, a respective width of the bond wires, and/or a respective diameter of the bond wires. The process for implementing a device includes configuring the set of primary interconnects 201 and the set of secondary interconnects 203 as a DC block between the first device implementation 470 and the second device implementation 450. The process for implementing a device includes attenuating and/or filtering lower frequency signals transferred between the first device implementation 470 and the second device implementation 450 with the set of primary interconnects 201 and the set of secondary interconnects 203. The process for implementing a device where the first device implementation 470 is implemented as a driver stage transistor; and where the second device implementation 450 is implemented as a final stage transistor. The process for implementing a device includes configuring the set of primary interconnects 201 and the set of secondary interconnects 203 as a transformer to provide RF signal coupling between the first device implementation 470 and the second device implementation 450. The process for implementing a device includes configuring the set of primary interconnects 201 and the set of secondary interconnects 203 to fanout between the first device implementation 470 and the second device implementation 450. The process for implementing a device includes providing a first IPD implementation 500 and a second IPD implementation 300, where the first device implementation 470 connects to the first IPD implementation 500 with one or more interconnects; and where the second device implementation 450 connects to the second IPD implementation 300 with one or more interconnects. The process for implementing a device includes connecting the first IPD implementation 500 to the second IPD implementation 300 with the set of secondary interconnects 203; and connecting the first IPD implementation 500 to the second IPD implementation 300 with the set of primary interconnects 201. The process for implementing a device includes configuring the first IPD implementation 500 with an inter-digitated array of one or more interconnect pads; and configuring the second IPD implementation 300 with an inter-digitated array of one or more interconnect pads. The process for implementing a device includes configuring the first IPD implementation 500 with an inter-digitated array of capacitors; and configuring the second IPD implementation 300 with an inter-digitated array capacitors. The process for implementing a device includes configuring the first IPD implementation 500 with at least one capacitor; and configuring the second IPD implementation 300 with at least one capacitor. The process for implementing a device where the first IPD implementation 500, the second IPD implementation 300, the set of primary interconnects 201, and the set of secondary interconnects 203 are configured to provide the RF signal from the first device implementation 470 to the second device implementation 450.

Accordingly, the disclosure has provided a number of different IPD components, a RF product that implements a number of different types of IPD components, and/or the like configured for reduced manufacturing cost, reduced manufacturing complexity, and reduced manufacturing times. Additionally, the disclosure has provided implementation of a package without a DC block. Moreover, the disclosure has provided implementation of a package attenuating and/or filtering undesirable low frequency signals and/or undesirable low frequency gain that may increase stability. Further, the disclosure has provided implementation of a package increasing bandwidth.

The following are a number of nonlimiting EXAMPLES of aspects of the disclosure. One EXAMPLE includes: EXAMPLE 1. A device that includes a metal submount; a first transistor die arranged on said metal submount; a second transistor die arranged on said metal submount; a set of primary interconnects; and a set of secondary interconnects, where the set of primary interconnects and the set of secondary interconnects are configured to provide RF signal coupling between the first transistor die and the second transistor die by electromagnetic coupling.

The above-noted EXAMPLE may further include any one or a combination of more than one of the following EXAMPLES: 2. The device according to any EXAMPLE herein where the set of primary interconnects and the set of secondary interconnects are configured to provide an interstage match. 3. The device according to any EXAMPLE herein where the set of primary interconnects and the set of secondary interconnects includes wires. 4. The device according to any EXAMPLE herein where the set of primary interconnects and the set of secondary interconnects includes bond wires; and where the set of primary interconnects and the set of secondary interconnects implemented to provide a desired impedance based on a respective number of the bond wires, a respective size of the bond wires, a respective width of the bond wires, and/or a respective diameter of the bond wires. 5. The device according to any EXAMPLE herein where the set of primary interconnects and the set of secondary interconnects are configured as a DC block between the first transistor die and the second transistor die. 6. The device according to any EXAMPLE herein where the set of primary interconnects and the set of secondary interconnects attenuate and/or filter lower frequency signals transferred between the first transistor die and the second transistor die. 7. The device according to any EXAMPLE herein where the first transistor die is implemented as a driver stage transistor; and where the second transistor die is implemented as a final stage transistor. 8. The device according to any EXAMPLE herein where the set of primary interconnects and the set of secondary interconnects are configured as a transformer to provide RF signal coupling between the first transistor die and the second transistor die. 9. The device according to any EXAMPLE herein where the set of primary interconnects and the set of secondary interconnects are configured to fanout between the first transistor die and the second transistor die. 10. The device according to any EXAMPLE herein includes: a first Integrated Passive Device (IPD) and a second Integrated Passive Device (IPD), where the first transistor die connects to the first Integrated Passive Device (IPD) with one or more interconnects; and where the second transistor die connects to the second Integrated Passive Device (IPD) with one or more interconnects. 11. The device according to any EXAMPLE herein where the first Integrated Passive Device (IPD) connects to the second Integrated Passive Device (IPD) with the set of secondary interconnects; and where the first Integrated Passive Device (IPD) connects to the second Integrated Passive Device (IPD) with the set of primary interconnects. 12. The device according to any EXAMPLE herein where the first Integrated Passive Device (IPD) includes an inter-digitated array of one or more interconnect pads; and where the second Integrated Passive Device (IPD) includes an inter-digitated array of one or more interconnect pads. 13. The device according to any EXAMPLE herein where the first Integrated Passive Device (IPD) includes an inter-digitated array of capacitors; and where the second Integrated Passive Device (IPD) includes an inter-digitated array capacitors. 14. The device according to any EXAMPLE herein where the first Integrated Passive Device (IPD) includes at least one capacitor; and where the second Integrated Passive Device (IPD) includes at least one capacitor. 15. The device according to any EXAMPLE herein where the first Integrated Passive Device (IPD), the second Integrated Passive Device (IPD), the set of primary interconnects, and the set of secondary interconnects are configured to provide the RF signal from the first transistor die to the second transistor die.

One EXAMPLE includes: EXAMPLE 16. A process for implementing a device that includes providing a metal submount; arranging a first transistor die on said metal submount; arranging a second transistor die on said metal submount; providing a set of primary interconnects; and providing a set of secondary interconnects, where the set of primary interconnects and the set of secondary interconnects are configured to provide RF signal coupling between the first transistor die and the second transistor die by electromagnetic coupling.

The above-noted EXAMPLE may further include any one or a combination of more than one of the following EXAMPLES: 17. The process for implementing a device according to any EXAMPLE herein includes configuring the set of primary interconnects and the set of secondary interconnects to provide an interstage match. 18. The process for implementing a device according to any EXAMPLE herein where the set of primary interconnects and the set of secondary interconnects includes wires. 19. The process for implementing a device according to any EXAMPLE herein where the set of primary interconnects and the set of secondary interconnects includes bond wires; and the process includes: implementing the set of primary interconnects and the set of secondary interconnects to provide a desired impedance based on a respective number of the bond wires, a respective size of the bond wires, a respective width of the bond wires, and/or a respective diameter of the bond wires. 20. The process for implementing a device according to any EXAMPLE herein includes configuring the set of primary interconnects and the set of secondary interconnects as a DC block between the first transistor die and the second transistor die. 21. The process for implementing a device according to any EXAMPLE herein includes attenuating and/or filtering lower frequency signals transferred between the first transistor die and the second transistor die with the set of primary interconnects and the set of secondary interconnects. 22. The process for implementing a device according to any EXAMPLE herein where the first transistor die is implemented as a driver stage transistor; and where the second transistor die is implemented as a final stage transistor. 23. The process for implementing a device according to any EXAMPLE herein includes configuring the set of primary interconnects and the set of secondary interconnects as a transformer to provide RF signal coupling between the first transistor die and the second transistor die. 24. The process for implementing a device according to any EXAMPLE herein includes configuring the set of primary interconnects and the set of secondary interconnects to fanout between the first transistor die and the second transistor die. 25. The process for implementing a device according to any EXAMPLE herein includes: providing a first Integrated Passive Device (IPD) and a second Integrated Passive Device (IPD), where the first transistor die connects to the first Integrated Passive Device (IPD) with one or more interconnects; and where the second transistor die connects to the second Integrated Passive Device (IPD) with one or more interconnects. 26. The process for implementing a device according to any EXAMPLE herein includes: connecting the first Integrated Passive Device (IPD) to the second Integrated Passive Device (IPD) with the set of secondary interconnects; and connecting the first Integrated Passive Device (IPD) to the second Integrated Passive Device (IPD) with the set of primary interconnects. 27. The process for implementing a device according to any EXAMPLE herein includes: configuring the first Integrated Passive Device (IPD) with an inter-digitated array of one or more interconnect pads; and configuring the second Integrated Passive Device (IPD) with an inter-digitated array of one or more interconnect pads. 28. The process for implementing a device according to any EXAMPLE herein includes: configuring the first Integrated Passive Device (IPD) with an inter-digitated array of capacitors; and configuring the second Integrated Passive Device (IPD) with an inter-digitated array capacitors. 29. The process for implementing a device according to any EXAMPLE herein includes: configuring the first Integrated Passive Device (IPD) with at least one capacitor; and configuring the second Integrated Passive Device (IPD) with at least one capacitor. 30. The process for implementing a device according to any EXAMPLE herein where the first Integrated Passive Device (IPD), the second Integrated Passive Device (IPD), the set of primary interconnects, and the set of secondary interconnects are configured to provide the RF signal from the first transistor die to the second transistor die.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A device, comprising:
a metal submount;
a first transistor die arranged on said metal submount;
a second transistor die arranged on said metal submount;
a set of primary interconnects; and
a set of secondary interconnects,
wherein the set of primary interconnects and the set of secondary interconnects are arranged and configured to provide RF signal coupling between the first transistor die and the second transistor die by electromagnetic coupling to transfer an RF signal between the first transistor die and the second transistor die.

2. The device according to claim 1 wherein the set of primary interconnects and the set of secondary interconnects are configured to provide an interstage match.

3. The device according to claim 1 wherein the set of primary interconnects and the set of secondary interconnects comprise wires.

4. The device according to claim 1 wherein the set of primary interconnects and the set of secondary interconnects are configured as a DC block between the first transistor die and the second transistor die.

5. The device according to claim 1 wherein the set of primary interconnects and the set of secondary interconnects attenuate and/or filter lower frequency signals transferred between the first transistor die and the second transistor die.

6. The device according to claim 1
wherein the first transistor die is implemented as a driver stage transistor; and
wherein the second transistor die is implemented as a final stage transistor.

7. The device according to claim 1 wherein the set of primary interconnects and the set of secondary interconnects are configured as a transformer to provide RF signal coupling between the first transistor die and the second transistor die.

8. The device according to claim 1 wherein the set of primary interconnects and the set of secondary interconnects are configured to fanout between the first transistor die and the second transistor die.

9. The device according to claim 1
wherein the set of primary interconnects and the set of secondary interconnects comprise bond wires; and
wherein the set of primary interconnects and the set of secondary interconnects implemented to provide a desired impedance based on a respective number of the bond wires, a respective size of the bond wires, a respective width of the bond wires, and/or a respective diameter of the bond wires.

10. The device according to claim 1 wherein the set of primary interconnects and the set of secondary interconnects are configured as a DC block between the first transistor die and the second transistor die.

11. The device according to claim 1 wherein the set of primary interconnects and the set of secondary interconnects attenuate and/or filter lower frequency signals transferred between the first transistor die and the second transistor die.

12. The device according to claim 1
wherein the first transistor die is implemented as a driver stage transistor; and
wherein the second transistor die is implemented as a final stage transistor.

13. The device according to claim 1 wherein the set of primary interconnects and the set of secondary interconnects are configured as a transformer to provide RF signal coupling between the first transistor die and the second transistor die.

14. The device according to claim 1 wherein the set of primary interconnects and the set of secondary interconnects are configured to fanout between the first transistor die and the second transistor die.

15. The device according to claim 1 further comprising:
a first Integrated Passive Device (IPD) and a second Integrated Passive Device (IPD),
wherein the first transistor die connects to the first Integrated Passive Device (IPD) with one or more interconnects; and
wherein the second transistor die connects to the second Integrated Passive Device (IPD) with one or more interconnects.

16. The device according to claim 15
wherein the first Integrated Passive Device (IPD) connects to the second Integrated Passive Device (IPD) with the set of secondary interconnects; and
wherein the first Integrated Passive Device (IPD) connects to the second Integrated Passive Device (IPD) with the set of primary interconnects.

17. The device according to claim 15
wherein the first Integrated Passive Device (IPD) comprises an inter-digitated array of one or more interconnect pads; and
wherein the second Integrated Passive Device (IPD) comprises an inter-digitated array of one or more interconnect pads.

18. The device according to claim 15
wherein the first Integrated Passive Device (IPD) comprises an inter-digitated array of capacitors; and
wherein the second Integrated Passive Device (IPD) comprises an inter-digitated array capacitors.

19. The device according to claim 15
wherein the first Integrated Passive Device (IPD) comprises at least one capacitor; and
wherein the second Integrated Passive Device (IPD) comprises at least one capacitor.

20. The device according to claim 15 wherein the first Integrated Passive Device (IPD), the second Integrated Passive Device (IPD), the set of primary interconnects, and the set of secondary interconnects are configured to provide the RF signal from the first transistor die to the second transistor die.

21. A device, comprising:
a metal submount;
a first transistor die arranged on said metal submount;
a second transistor die arranged on said metal submount;
a set of primary interconnects; and
a set of secondary interconnects,
wherein the set of primary interconnects and the set of secondary interconnects are configured to provide RF signal coupling between the first transistor die and the second transistor die by electromagnetic coupling;
wherein the set of primary interconnects and the set of secondary interconnects comprise bond wires; and
wherein the set of primary interconnects and the set of secondary interconnects implemented to provide a desired impedance based on a respective number of the bond wires, a respective size of the bond wires, a respective width of the bond wires, and/or a respective diameter of the bond wires.

22. A device, comprising:
a metal submount;
a first transistor die arranged on said metal submount;
a second transistor die arranged on said metal submount;
a set of primary interconnects;
a set of secondary interconnects; and
a first Integrated Passive Device (IPD) and a second Integrated Passive Device (IPD),
wherein the set of primary interconnects and the set of secondary interconnects are configured to provide RF signal coupling between the first transistor die and the second transistor die by electromagnetic coupling;
wherein the first transistor die connects to the first Integrated Passive Device (IPD) with one or more interconnects; and
wherein the second transistor die connects to the second Integrated Passive Device (IPD) with one or more interconnects.

23. The device according to claim 22
wherein the first Integrated Passive Device (IPD) connects to the second Integrated Passive Device (IPD) with the set of secondary interconnects; and wherein the first Integrated Passive Device (IPD) connects to the second Integrated Passive Device (IPD) with the set of primary interconnects.

24. The device according to claim 22 wherein the first Integrated Passive Device (IPD) comprises an inter-digitated array of one or more interconnect pads; and wherein the second Integrated Passive Device (IPD) comprises an inter-digitated array of one or more interconnect pads.

25. The device according to claim 22 wherein the first Integrated Passive Device (IPD) comprises an inter-digitated array of capacitors; and wherein the second Integrated Passive Device (IPD) comprises an inter-digitated array capacitors.

26. The device according to claim 22 wherein the first Integrated Passive Device (IPD) comprises at least one capacitor; and wherein the second Integrated Passive Device (IPD) comprises at least one capacitor.

27. The device according to claim 22 wherein the first Integrated Passive Device (IPD), the second Integrated Passive Device (IPD), the set of primary interconnects, and the set of secondary interconnects are configured to provide the RF signal from the first transistor die to the second transistor die.

\* \* \* \* \*